US006831835B2

(12) United States Patent
Soto

(10) Patent No.: US 6,831,835 B2
(45) Date of Patent: Dec. 14, 2004

(54) MULTI-LAYER LAMINATED STRUCTURES, METHOD FOR FABRICATING SUCH STRUCTURES, AND POWER SUPPLY INCLUDING SUCH STRUCTURES

(75) Inventor: Louis Soto, Warwick, RI (US)

(73) Assignee: Ault, Inc., Minneapolis, MN (US)

(*) Notice: Subject to any disclaimer, the term of this patent is extended or adjusted under 35 U.S.C. 154(b) by 36 days.

(21) Appl. No.: 10/329,314

(22) Filed: Dec. 24, 2002

(65) Prior Publication Data

US 2004/0120120 A1 Jun. 24, 2004

(51) Int. Cl.[7] .............................. H05K 7/20; H05K 1/00
(52) U.S. Cl. .................... 361/704; 174/252; 174/254; 257/691; 257/686; 257/723; 361/710; 361/715; 361/719; 361/749
(58) Field of Search ................................ 174/252, 254; 257/686, 691, 723, 777; 361/704, 707, 709–710, 715, 749–750, 792–795, 719–721

(56) References Cited

U.S. PATENT DOCUMENTS

| | | | | |
|---|---|---|---|---|
| 29,274 | A | | 7/1860 | Helton ........................ 336/223 |
| 4,495,546 | A | * | 1/1985 | Nakamura et al. .......... 361/749 |
| 4,567,543 | A | * | 1/1986 | Miniet ........................ 361/749 |
| 4,574,879 | A | | 3/1986 | DeGree et al. ............. 165/185 |
| 4,602,125 | A | | 7/1986 | West et al. .................. 174/138 |
| 4,602,678 | A | | 7/1986 | Fick ............................ 165/79 |
| 4,666,545 | A | | 5/1987 | DeGree et al. ............. 156/252 |
| 4,685,987 | A | | 8/1987 | Fick ............................ 156/247 |
| 4,755,249 | A | | 7/1988 | DeGree et al. ............. 156/252 |
| 4,792,879 | A | * | 12/1988 | Bauknecht et al. ......... 361/816 |
| 4,810,563 | A | | 3/1989 | DeGree et al. ............. 428/209 |
| 4,842,911 | A | | 6/1989 | Fick ............................ 428/40 |
| 4,853,763 | A | | 8/1989 | DeGree et al. ............... 357/81 |
| 4,959,630 | A | | 9/1990 | Yerman et al. ............... 336/83 |
| 5,170,326 | A | * | 12/1992 | Meny et al. ................. 361/736 |
| 5,276,421 | A | | 1/1994 | Boitard ....................... 336/180 |
| 5,448,511 | A | * | 9/1995 | Paurus et al. ................ 365/52 |
| 5,463,530 | A | | 10/1995 | DeGree ....................... 361/707 |
| 5,519,358 | A | | 5/1996 | Tserng ........................ 330/307 |
| 5,650,593 | A | | 7/1997 | McMillan et al. ......... 174/52.4 |
| 5,679,457 | A | | 10/1997 | Bergerson ................... 428/344 |
| 5,754,409 | A | | 5/1998 | Smith ......................... 361/803 |
| 5,777,844 | A | | 7/1998 | Kiefer ........................ 361/704 |
| 5,950,066 | A | | 9/1999 | Hanson et al. .............. 428/551 |
| 5,969,945 | A | * | 10/1999 | Cutting et al. .............. 361/704 |
| 5,986,887 | A | | 11/1999 | Smith et al. ................ 361/704 |
| 6,015,607 | A | | 1/2000 | Fraivillig .................... 428/214 |
| 6,075,701 | A | | 6/2000 | Ali et al. .................... 361/704 |
| 6,090,484 | A | | 7/2000 | Bergerson ................... 428/355 |
| 6,129,260 | A | | 10/2000 | Andrus et al. .............. 228/120 |
| 6,165,612 | A | | 12/2000 | Misra ......................... 428/344 |
| 6,169,659 | B1 | | 1/2001 | Wheaton ..................... 361/704 |
| 6,197,859 | B1 | | 3/2001 | Green et al. ................ 524/270 |
| 6,208,031 | B1 | | 3/2001 | Fraivillig .................... 257/758 |

(List continued on next page.)

OTHER PUBLICATIONS

Derman, Glenda, "Density forces a bend in contacts" pp. 1–10, Electronic Engineering Times, Dec. 1997, Issue 984, p. 105.

(List continued on next page.)

Primary Examiner—Gregory Thompson
(74) Attorney, Agent, or Firm—Merchant & Gould P.C.

(57) ABSTRACT

Multi-layer laminated structures on which electrical devices may be mounted, methods for fabricating such structures, and power supplies including such structures are disclosed. One such multi-layer laminated structure include a first portion on which at least one electrical device may be mounted and further includes a portion that overlays a fractional portion of a major surface of the first portion and on which at least one electrical device may be mounted.

45 Claims, 19 Drawing Sheets

U.S. PATENT DOCUMENTS

| | | | |
|---|---|---|---|
| 6,222,437 B1 | 4/2001 | Soto et al. | 336/200 |
| 6,275,111 B1 | 8/2001 | Seely et al. | 330/286 |
| 6,339,120 B1 | 1/2002 | Misra et al. | 524/404 |
| 6,359,515 B1 | 3/2002 | Buer | 330/295 |
| 6,362,689 B1 | 3/2002 | Buer | 330/295 |
| 6,388,528 B1 | 5/2002 | Buer et al. | 330/295 |
| 6,399,209 B1 | 6/2002 | Misra et al. | 428/447 |
| 2001/0008306 A1 | 7/2001 | Kamei et al. | 257/723 |
| 2002/0030973 A1 | 3/2002 | Scafidi | 361/709 |
| 2002/0080586 A1 | 6/2002 | Siu | 361/709 |

OTHER PUBLICATIONS

Chichilli, Deepak, et al. "Investigation of the bond strength of polyimide adhesive" Technical Division/Engineering and Fabrication Dept. Jan. 1998, pp. 1–7.

The Berquist Company, "Thermal Clad Selection Guide" Jan. 2002, pp. 1–29.

de Sorgo, Miksa, "A thermal comparison of power device mounting technologies" Power Site, Automated Power Semiconductor Attachment, Chromerics Div., Parker Hannifan Corporation, Dec. 2000, pp. 1–7.

* cited by examiner

MULTI-LAYER LAMINATED STRUCTURES, METHOD FOR FABRICATING SUCH STRUCTURES, AND POWER SUPPLY INCLUDING SUCH STRUCTURES

TECHNICAL FIELD

This invention relates to structures for mounting electrical devices, and more particularly, to multi-layer, laminated structures on which electrical devices may be mounted, to methods for fabricating such structures, and to power supplies including such structures.

RELATED ART

Many systems employ electrical devices. It is often desirable to densely pack these devices so as to reduce the size of the system. Indeed, the ability to do so can be essential to meeting the demand for systems having smaller packages and ever increasing power densities.

As a result, electrical devices are often mounted on printed circuit boards, which use printed circuitry rather than discrete wires. Where the number of electrical devices in a system demands, multiple printed circuit boards are employed. Some systems stack such printed circuits boards, one on top of one another, in order fit them all within the system.

One drawback associated with the stacking of printed circuit boards is that the spacing between the boards is often dictated by the dimensions of the tallest devices on the boards. Consequently, unless all of the devices on a particular board have the same height, at least a portion of the volume between adjacent boards is unused and thus wasted.

Another drawback associated with the stacking of printed circuit boards is that connectors are often needed to electrically connect one printed circuit board to another. The need for such connectors adds size, weight, labor and cost to the system.

Flexible substrates are sometimes employed in place of connectors to solve the connector issue, however, flexible substrates do not solve the issue of unused volume between boards.

Accordingly, it is an object of the present invention to provide laminated structures for mounting electrical devices and methods of making such structures that overcome one or more of the above described drawbacks of the prior art.

SUMMARY

According to a first aspect of the present invention, a circuit includes a multi-layer laminate having a first portion and a second portion. The first portion has a first major surface on which at least one electrical device is mounted. The second portion is attached to the first portion and folded so as to provide at least one substantially planar portion that overlays a fractional portion of the first major surface of the first portion and on which at least one electrical device is mounted.

According to another aspect of the present invention, a circuit includes a multi-layer laminate having a first portion with a first major surface on which at least one electrical device is mounted. The laminate further includes means for providing at least one substantially planar portion that overlays a fractional portion of the first major surface of the first portion and on which one or more electrical devices may be mounted and electrically connected to, said means being attached to the first portion and folded.

According to another aspect of the present invention, a method for forming an assembly includes providing a multi-layer laminate having first portion a second portion attached to the first portion. The first portion has a first major surface on which one or more electrical devices may be mounted. The method further includes folding the second portion so as to provide at least one substantially planar surface that overlays a fractional portion of the first major surface of the first portion and on which one or more electrical devices may be mounted.

According to another aspect of the present invention, a circuit includes a multi-layer laminate having a base portion and at least one second portion. The base portion has a first major surface adapted to receive one or more electrical devices to be mounted thereon. The at least one second portion extends from a marginal portion of the base portion and defines a folded portion overlying a fractional portion of the first major surface of the base portion, and on which at least one electrical device is mounted.

According to another aspect of the present invention, a circuit includes a multi-layer laminate having a base portion with a first major surface adapted to receive one or more electrical devices to be mounted thereon. The multi-layer laminate further includes first means extending from a marginal portion of the base portion for overlying a fractional portion of the first major surface of the base portion and mounting at least one electrical device thereto.

According to another aspect of the present invention, an assembly includes a multi-layer laminate having a first portion and a second portion. The first portion has a first major surface on which at least one electrical device is mounted. The second portion is attached to the first portion and is adapted to receive at least one electrical device, and includes means for positioning the at least one electrical device to be mounted on the second portion within a volume that overlays a fractional portion of the first major surface of the first portion.

According to other aspects of the present invention, a power supply includes a circuit in accordance with one or more of the above aspects.

One advantage of the currently preferred embodiments of the present invention is that they provide a substantially planar surface that overlays only a fractional portion of another circuit thereby making it possible to "pack" electrical devices into areas that might otherwise be unused (e.g., above components that are relatively short). As a result, more devices can be packed into a given volume, thereby helping to achieve a desired power density. In addition, in at least some embodiments, the devices mounted on the substantially planar surface of the substantially flexible circuit can be electrically connected by way of the flexible circuit, thereby avoiding the need to add additional connectors, along with the added weight, labor and cost typically associated with adding connectors.

Other advantages of the multi-layer laminate and method of the present invention will become apparent in view of the following detailed description of preferred embodiments, claims, and accompanying drawings.

DETAILED DESCRIPTION

Figure 1:
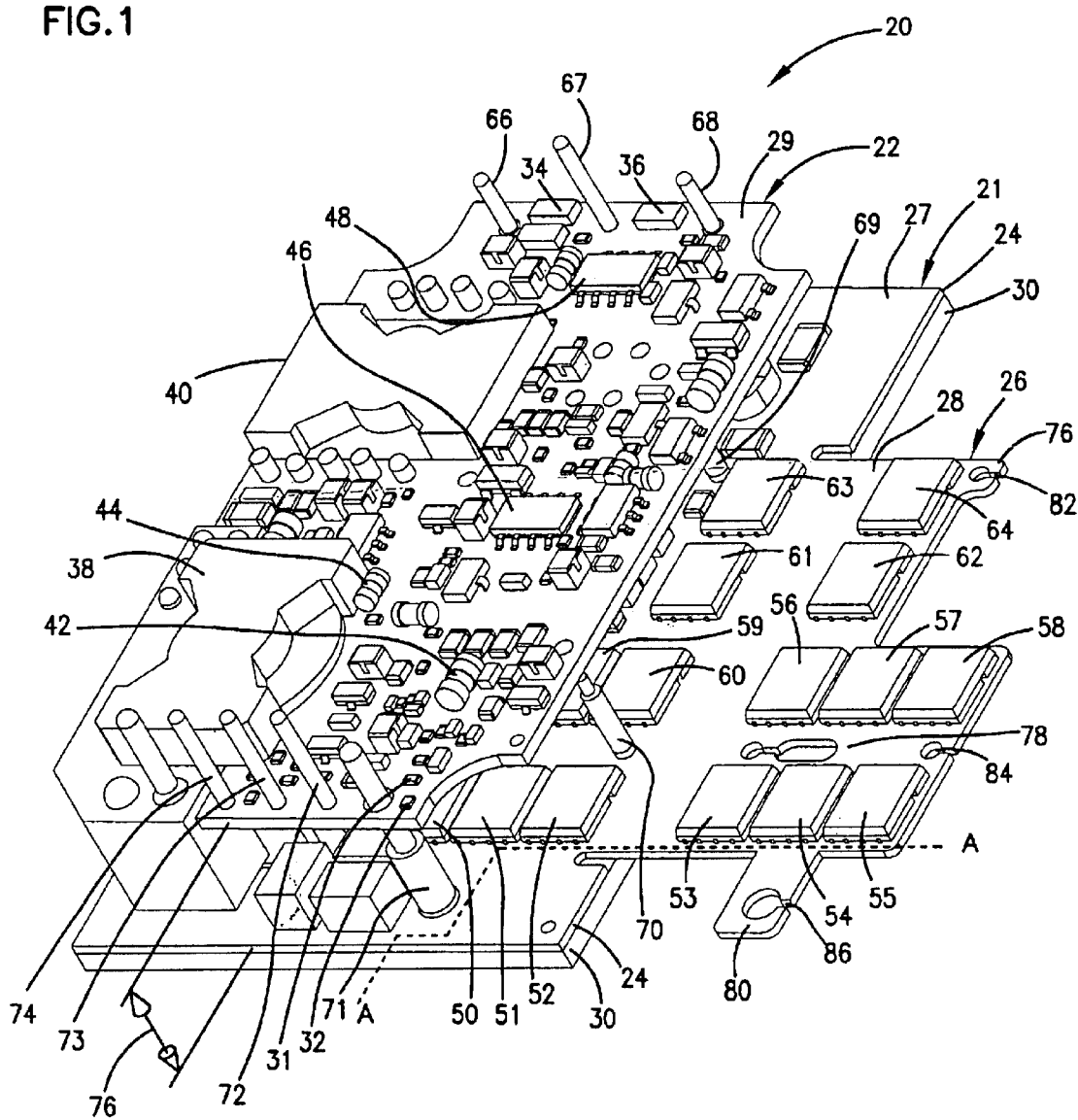
FIG. 1 is a partially assembled, perspective view of a power supply assembly having a multi-layer laminate in accordance with one embodiment of the present invention.

FIG. 1 is a perspective view of a power supply assembly 20 (shown in a partially assembled state) which employs a multi-layer laminate according to one embodiment of the present invention. The power supply assembly 20 includes a first multi-layer laminate 21, a second multi-layer laminate 22 and a plurality of electrical devices (which are further discussed below) mounted thereon. The first laminate 21 includes a printed circuit having a first portion 24 (sometimes referred to hereafter as a "base portion") and a second portion 26. The first portion 24 has a first major surface 27 and may be joined to a heat sink 30 as shown. The second portion 26 extends from a marginal portion of the first portion and has a first major surface 28. As will be further described hereinafter, the second portion 26 is to be folded in the course of further assembling the power supply assembly 20. The second laminate 22 is a conventional multi-layer printed circuit board and has a first major surface 29.

The heat sink 30 may be rigid (i.e., relative to the first portion 24) or at least substantially rigid, although this is not required. The first portion 24 and/or heat sink 30 may be attached to a chassis or some other structure (not shown).

The electrical devices include various types of devices, for example, resistors 31, 32, capacitors 34, 36, transformers 38, 40, diodes 42, 44, and integrated circuits 46–64. These devices are shown having a surface mountable form, however, this is not a requirement of the present invention. Most of the devices mounted on the second laminate 22 have relatively "low" power dissipation. Most of the devices having relatively "high" power dissipation are mounted on the first laminate 21.

A plurality of support members 66–74 extend from the first laminate 21. These support members position and support the second laminate 22 at a predetermined distance (e.g., height) 76 above the first laminate 21. The predetermined distance 76 is selected so as to maintain clearance between the second laminate 22 and upper surfaces of the tallest devices (not shown) overlayed by the second laminate 22. The second laminate 22 does not overlay the transformers 38, 40 in order to keep the overall dimensions of the power supply assembly 20 within desired specified limits. Consequently, the second laminate 22 has an irregular shape adapted to avoid mechanical interference with the transformers 38, 40. The support members 66–68 and 71–74 have pin-shaped ends that serve as input and output terminals for the power supply assembly 20.

The second portion 26 of the first laminate 21 has hangars 76, 78, 80, that are attachable to support members 69, 70, 71, respectively. In particular, the hangar 76 has a slotted portion 82 to receive the support member 69 and attach the hangar 76 thereto. Likewise, hangars 78, 80 have slotted portions 84, 86, to attach hangars 78, 80 to support members 70, 71, respectively. As will be further described hereinafter, the support members 69, 70, 71 provide structural support for the second portion 26 when the second portion is in a folded state.

Figure 2:
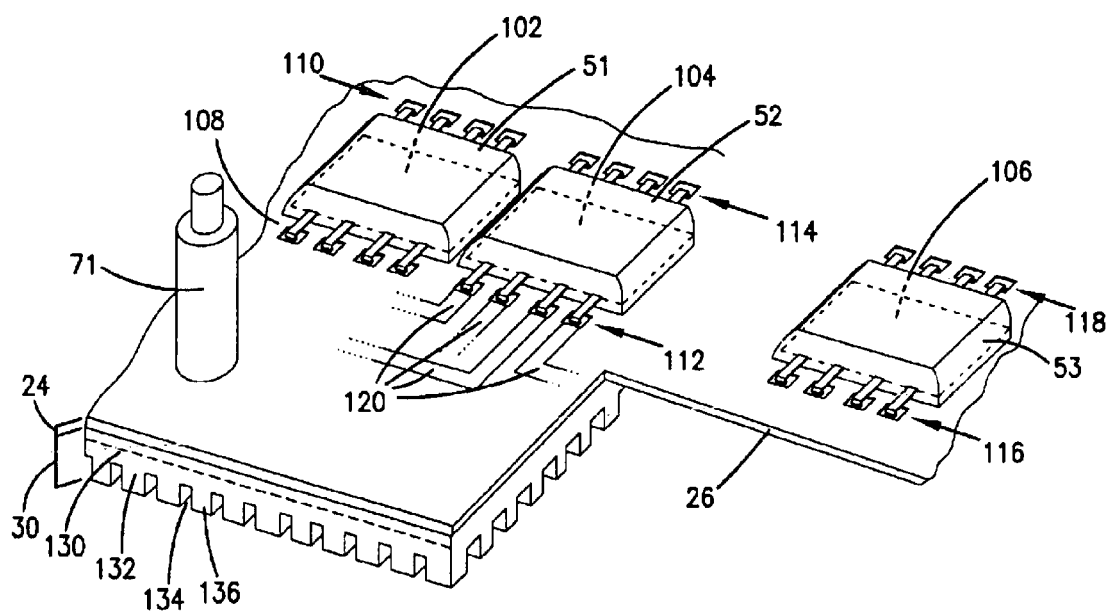
FIG. 2 is a perspective view of a portion of the first laminate of FIG. 1.

FIG. 2 is an enlarged, perspective view of a portion of the first laminate 21. As shown in FIG. 2, the first portion 24 and the second portion 26 are each adapted to receive and electrically connect to one or more electrical devices. For example, the first portion 24 has areas 102 and 104 on which electrical devices may be mounted. Device 51 is mounted on mounting area 102. Device 52 is mounted on mounting area 104. The second portion 26 has area 106 on which device 53 is mounted. Each of the mounting areas 102, 104 and 106 includes one or more terminals for electrically connecting to the electrical device to be mounted thereon. For example, mounting area 102 includes terminals 108, 110 which connect to device 51. Mounting area 104 includes terminals 112, 114 for electrically connecting to device 52. Likewise, mounting area 106 includes terminals 116, 118 for electrically connecting to device 53. The first and second portions 24, 26 further include a plurality of electrically conductive traces, for example as indicated at 120, to form one or more electric circuits.

The heat sink 30 can be viewed as a one piece, integrally formed, "finned" heat sink having a first portion 130 and a second portion 132. In this embodiment, at least one of these portions 130, 132 is substantially rigid (i.e., relative to the first portion 24, which in this embodiment is formed of substantially flexible components) so as to provide support for the first portion 24. The first portion 130 of the heat sink 30 is substantially planar on each of its major surfaces. The second portion 132 has a major outer surface 134 and a plurality of fins 136 extending therefrom. The fins 136, which are shown as rectangular but which may have any size and shape, improve thermal conductivity between the heat sink 30 and the ambient air. The heat sink 30 is preferably metal so as to provide high thermal conductivity.

It should be recognized that because the heat sink 30 is a single piece, it may provide better thermal conductivity than a similarly sized and shaped multi-piece structure, all else being equal. In addition, the one piece structure may have a thinner profile than the multi-piece structure (because the multi-piece structure has an additional joint and an accompanying adhesive layer), thereby reducing the volume needed for the heat sink. This in turn may make it possible to deliver greater performance (e.g., power) without increasing the size of the overall system, all else being equal.

Figure 3:
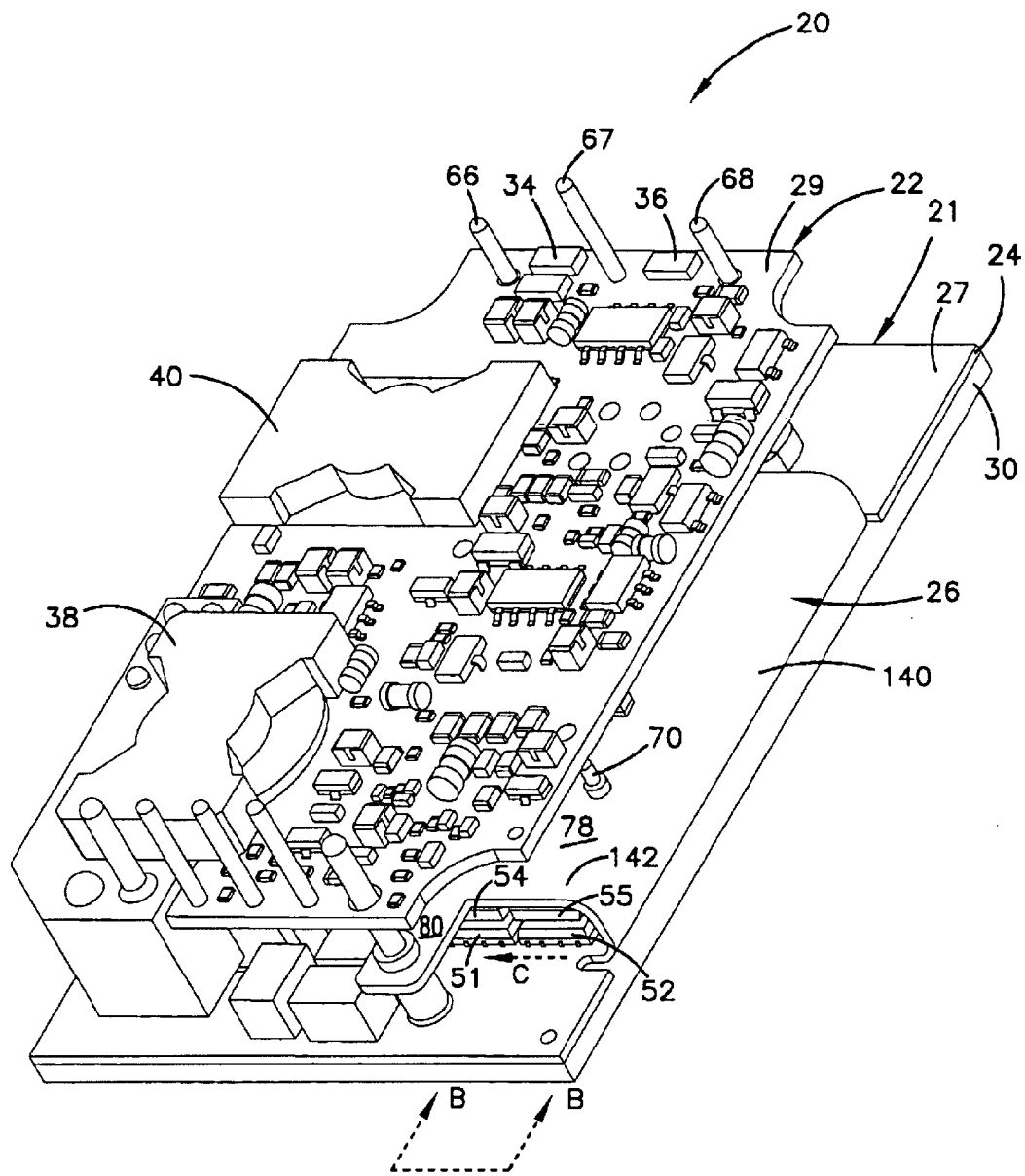
FIG. 3 is perspective view of the power supply assembly of FIG. 1, with the second portion of the first laminate of FIG. 1 in a folded state.

FIG. 3 is a perspective view of the power supply assembly 20 with the second portion 26 in a folded state. In this folded state, the second portion 26 has one fold 140 and a substantially planar portion 142 that overlays a fractional portion of the first major surface 27 of the first portion 24. Devices 53–55, 56–57, 62 and 64 (FIG. 1), mounted on the substantially planar portion 142 of the second portion 26, overlay and physically rest on devices 50–51, 59–60, 61 and 63 (FIG. 1), respectively, mounted on the fractional portion of the first major surface 27 of the first portion 24. Likewise, device 58 overlays and physically rests on a device (not shown). Hangars 76, 78, 80 are attached to the support members 69, 70, 71, wherein the support members 69, 70, 71 provide structural support for the second portion 26. In some embodiments, these support members 69, 70, 71 also act as a thermal path to help remove heat from the devices mounted on the second portion 26.

With the second portion 26 folded as such, devices 53–55, 56–57, 62 and 64 are "packed" into areas that would otherwise be unused in this embodiment. As a result, less volume may be needed, thereby helping to achieve a desired power density. Moreover, in this embodiment, this is accomplished without the need to add additional connectors, thereby avoiding the added weight, labor and cost, typically associated with connectors.

Figure 5:
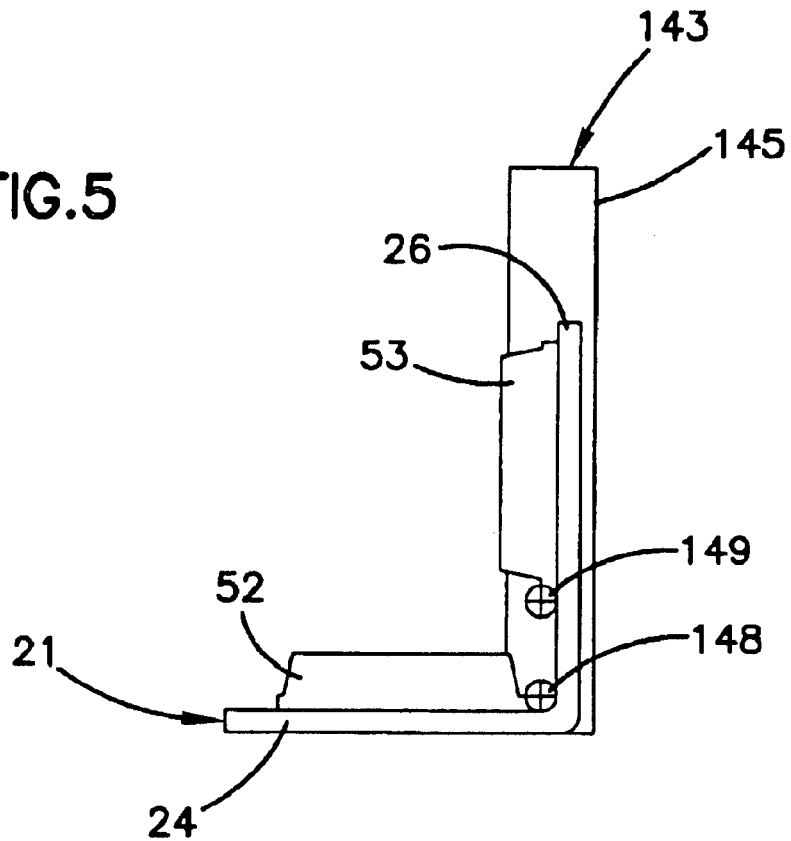
FIG. 5 is a side elevational view of the first and second portions of the first laminate and the fixture of FIG. 4, with the second portion in a first partially folded state.
Figure 6:
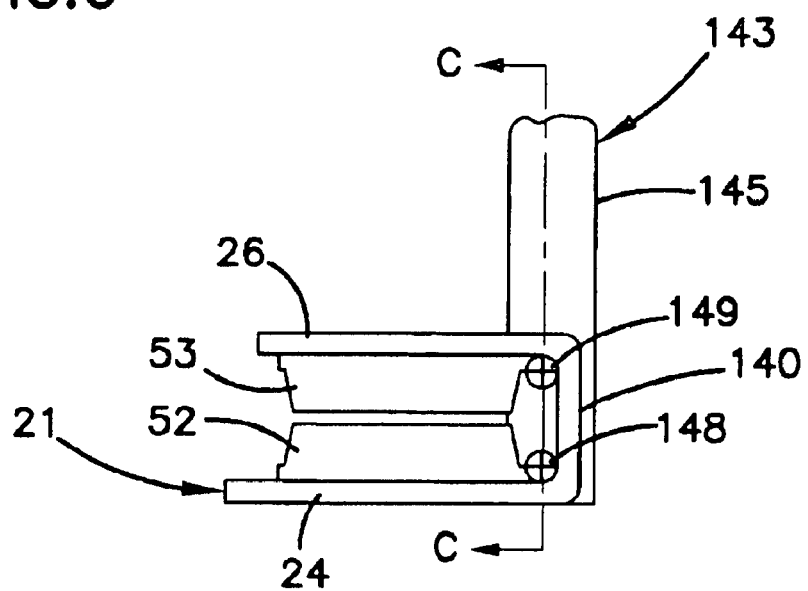
FIG. 6 is a side elevational view of the first and second portions of the first laminate and the fixture of FIG. 4, with the second portion in a second partially folded state.
Figure 7:
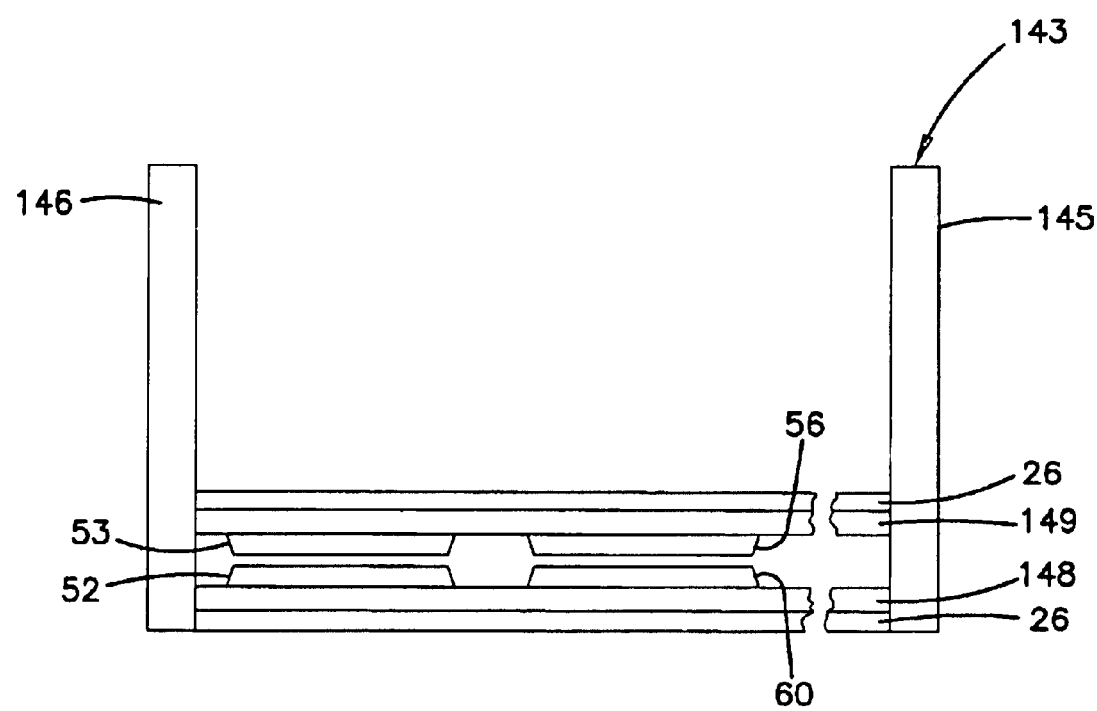
FIG. 7 is a cross-sectional view of the first and second portions of the first laminate, with the second portion in a folded state, taken in the direction of B—B (FIG. 3), in combination with a cross-sectional view of the fixture of FIG. 4.

FIGS. 4–6 and 7 are side elevational views of a portion of the laminate, with the electrical devices mounted thereon, that show one method for folding the second portion of the laminate. This method employs a fixture 143 to assist the folding process. Note that FIG. 7 shows a cross-sectional view of a portion of the laminate and the fixture 143. The fixture 143 includes a base 144 (not shown) and supports 145, 146. The fixture 143 further includes guide members 148, 149, which are supported by the supports 145, 146 and extend in the direction in which the fold 140 (FIGS. 3, 6) is to extend. The guide members 147, 148 may be cylindrically shaped, as shown, but are not limited to such.

Figure 4:
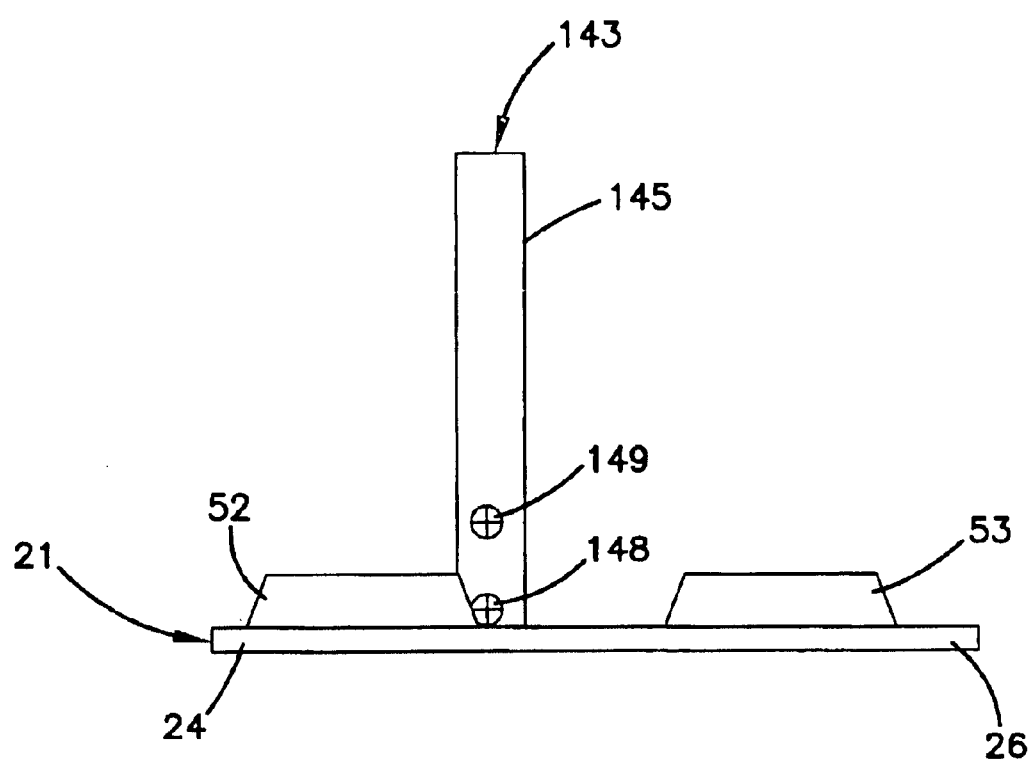
FIG. 4 is a side elevational view of the first and second portions of the first laminate, taken in the direction of B—B (FIG. 3), with the second portion in an un-folded state, in combination with a cross sectional view of a fixture that may be employed in folding the second portion.

Referring to FIG. 4, prior to forming the fold 140 (FIGS. 3, 6), the fixture 143 and/or the laminate 21 are positioned relative to one another. Referring to FIG. 5, the second portion 26 of the laminate is folded to form a radius around the first guide member 148 and contact the second guide member 149. Referring to FIG. 6, the second portion 26 of the laminate is then folded to form a radius around the second guide member 149, to thereby complete the fold 140.

In some embodiments, the laminate 21 is heated (prior to and/or concurrent with the folding process) to make the laminate more flexible for folding. However, in the event that the electrical devices have already been mounted and/or soldered onto the laminate, it is desirable to limit the amount of heat that is to be applied so as keep the temperature of the electrical components low enough (e.g., less than about 160 deg C.) and thereby preclude the possibility of damaging the electrical components or reflowing the solder.

Figure 8:
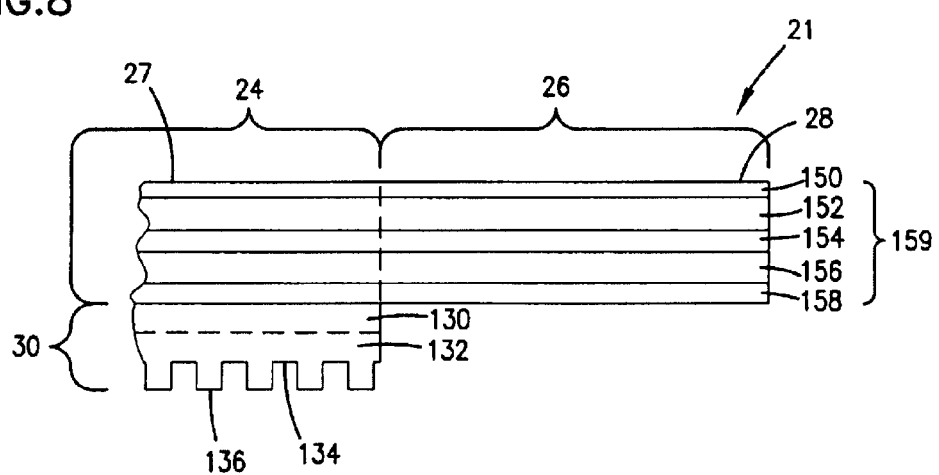
FIG. 8 is a cross-sectional view of a portion of the first laminate of FIG. 1 taken in the direction of A—A.

FIG. 8 is a cross-sectional view of a portion of the printed circuit and heat sink of the first laminate 21 taken along the direction A—A (FIG. 1). The printed circuit includes a solder mask 150 and a plurality of layers, including a first electrically conductive layer 152, a first isolation/bond layer 154, a second electrically conductive layer 156 and a second isolation/bond layer 158. Hereafter, the solder mask 150 and the layers 152–158 are collectively referred to as lay-up 159. The solder mask 150 may comprise any suitable material(s), for example, but not limited to XV601T SPRAY IMAGEFLEX, manufactured by Coates Circuit Products, a division of Coates Screen, of St. Charles, Ill.; and PYRALUX PC2000, with a UL-94 VTM-0 rating, which is manufactured by Dupont. The SPRAY IMAGEFLEX material is a thermal hardening, liquid, photo imageable flexible solder mask that dries by evaporation to form an aqueous processable film with a semi-gloss or semi-matte finish. Some embodiments employ the SPRAY IMAGEFLEX material to form a solder mask 150 having a thickness of about 0.002 inches to about 0.003 inches. The first and second electrically conductive layers 152, 156 may, comprise copper, copper foil, or any other suitably conductive material(s). The first and second electrically conductive layers 152, 156 interconnect to the electrical devices mounted on the laminate and have patterning to form traces and one or more electrical circuits. These layers 152, 156 may, comprise copper, copper foil, or any other suitably conductive material(s). In this embodiment, the first and second isolation/bond layers 154, 158 are substantially identical to one another, although this is not required for all embodiments of all aspects of the present invention.

The thickness of the lay-up 159 is preferably less than or equal to about 0.125 inches. However, in this embodiment, the thickness of the lay-up 159 is, for example, in the range of from about 0.013 inches to about 0.015 inches. The thickness of the heat sink 30, less the height of any fins, is preferably greater than or equal to about 0.03 inches and more preferably greater than or equal to about 0.04 inches. In some embodiments, the fins extend about 0.06 inches, but the fins are not limited to such.

Figure 9:
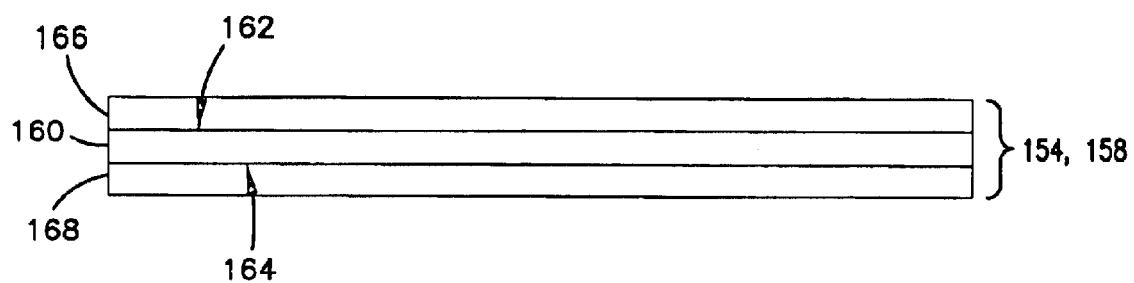
FIG. 9 is a cross-sectional view of one embodiment of the isolation/bond layers of FIG. 8.

FIG. 9 shows a cross section view of one embodiment of the isolation/bond layers 154, 158. This embodiment includes three layers: (1) a flexible substrate layer 160 having a first major surface 162 and a second major surface 164, (2) a first adhesive layer 166 on the first major surface 162 of the substrate layer 160, and (3) a second adhesive layer 168 on the second major surface 164 of the substrate layer 160.

The isolation/bond layers 154, 158 may be formed in any manner that is currently known, or later becomes known for performing the functions of these layers as described herein. In some embodiments, the first and/or second isolation/bond layers 154, 158 are manufactured in accordance with one or more of the methods and materials set forth in U.S. Pat. Nos.

6,015,607 and/or 6,208,031, each of which is incorporated herein by reference. In such embodiments, the flexible substrate layer 160 may comprise a flexible film (for example comprising a polyimide, polyester and/or a polyetherimide) and the adhesive layers 166, 168 may comprise a polyetherimide adhesive, for example Ultem, and siloxane polyetherimide copolymer, for example Siltem (both of which are trademarks of G. E. Plastics). Hereafter, the term "polyetherimide" includes polyetherimide adhesives, for example Ultem, and siloxane polyetherimide copolymers, for example Siltem, unless stated otherwise.

In some embodiments, the isolation/bond layers 154, 158 comprise TPI-130, manufactured by Fraivillig Technologies of Marlboro, Ma., which is a multi-layer product having (1) a flexible substrate layer, (2) a first adhesive layer on a first major surface of the flexible substrate layer, and (3) a second adhesive layer on a second major surface of the flexible substrate layer.

In a preferred embodiment, (further described hereinafter with respect to FIG. 8) the first and second adhesive layers 166, 168 each comprise an adhesive that is activatable at a first set of processing conditions and re-activatable at a second set of processing conditions. A set of processing conditions may include, for example, but is not limited to: one or more temperatures, one or more pressures, and the time duration(s) that the temperature(s) and pressure(s) are applied. The second set of processing conditions differs from the first set of processing conditions in at least one respect. For example, the second set of processing conditions may differ from the first set of processing conditions in regard to the temperature(s), the pressure(s), the duration for which the temperature(s) are applied, and/or the duration for which the pressure(s) are applied.

One method for fabricating the first laminate 21 includes the following two steps: (1) fabricating the lay-up 159 portion of the first laminate 21 (i.e., the portion of the first laminate 21 that comprises the solder mask 150 and layers 152–158), and (2) bonding the lay-up 159 to the heat sink 30. This method facilitates fabrication of laminates having heat sinks that are non-planar, such as for example, first laminate 21 which has a "finned" heat sink 30.

Figure 10:
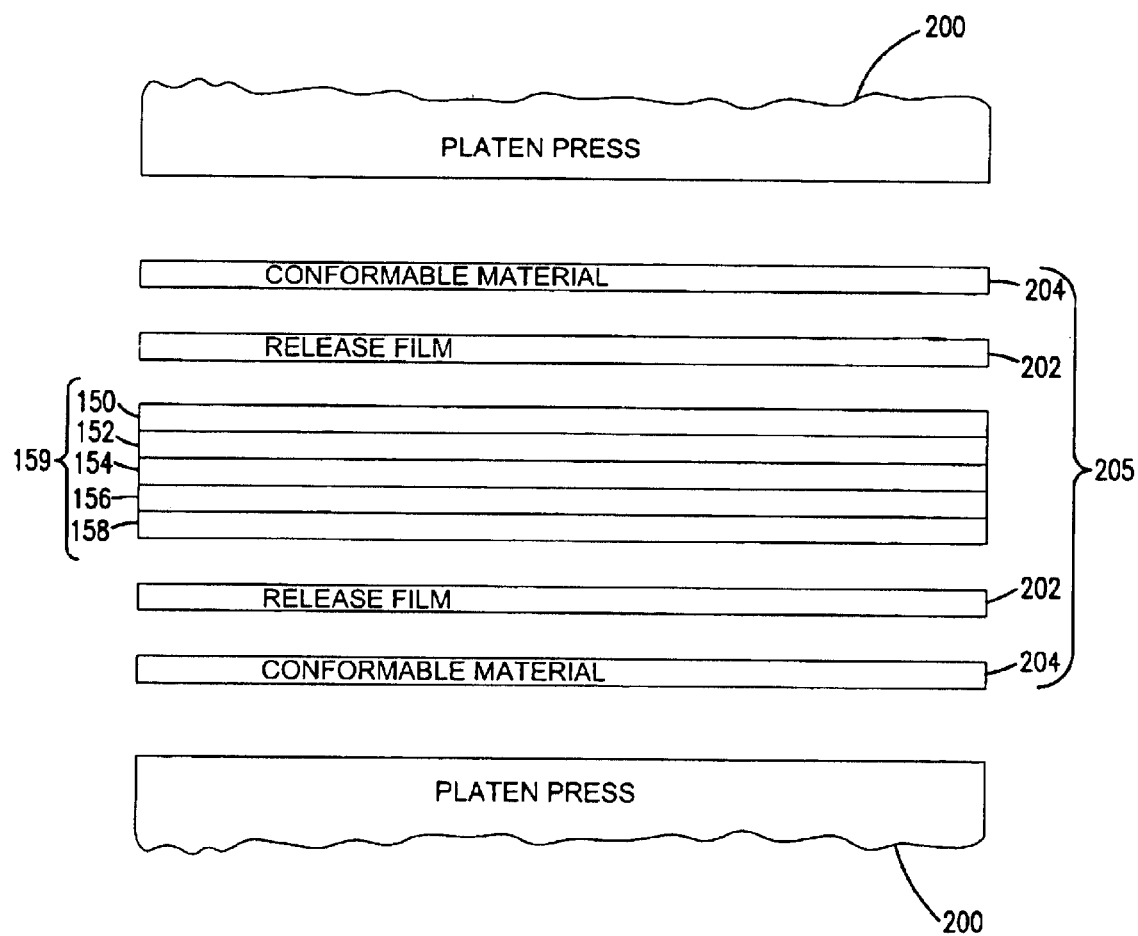
FIG. 10 shows one method for fabricating the lay-up portion of FIG. 8.

FIG. 10 illustrates one method for fabricating the lay-up 159 portion (i.e., the solder mask 150 and layers 152–158) of the first laminate 21. In this method, a multi-opening platen press 200 is used. Each platen 200 includes one or more heating elements (not shown) that heats the platen. The platen in turn transmits the heat to a workpiece in the platen press. The platens are initially heated to about 180 degrees centigrade (deg C.).

The solder mask 150 and the layers 152–158 which form the lay-up are assembled. The lay-up 159 is sandwiched between two release films 202 and two sheets of conformable material 204 to form a stack-up 205. The conformable material 204 is employed to help ensure that pressure will be sufficiently applied across the major outer surface of the first portion. That is, even if the major outer surface of the first portion is substantially planar, there may be some areas that are slightly raised compared to other areas, e.g., the surface areas over conductive traces may be slightly raised compared to surface areas without conductive traces.

The stack-up 205 is placed into the platen press 200. The initial pressure on the stack-up 205 is due merely to the weight of the platen. Pressure is then applied to the portion of the platen 200 that contacts the stack-up 205. This pressure is in turn delivered to the stack-up 205. The magnitude of the pressure may be, for example, in the range of from about 1 pound per square inch (psi) to about 10 psi. These temperature and pressure conditions are maintained for a time duration in the range of from about 2 minutes to about 4 minutes in order to help eliminate (or at least reduce) residual moisture from the lay-up 159.

The pressure and/or the temperature is then increased to provide conditions (e.g., temperature, pressure, time duration) suitable to activate the adhesive layers 162, 164 to a degree sufficient to form at least a tack-bond between the electrically conductive layers 152, 156 and the isolation/bond layers 154, 158, yet leave enough re-activity in the second isolation/bond layer 158 to allow the layer 158 to be bonded to another surface at a future time. For example, in this embodiment, the temperature is maintained at about 180 deg C. and the magnitude of the applied pressure is increased to greater than or equal to about 500 psi. These conditions are maintained for about 1 minute. The press is opened while still at about 180 deg C. and the stack-up 205 is removed while in a 'hot state'. If desired, the edge of the lay-up 159 may be checked to verify the existence of a tack-bond between the electrically conductive layers 152, 156 and the isolation/bond layers 154, 158. However, it is desirable to prevent air entrapment and/or voids in the first laminate 21. The lay-up may be removed from the plate/lay-up assembly using a steel-rule or equivalent, for example.

The conformable material 204 shown in FIG. 8 may, for example, be pacoform or rubber. The release film 202 material may, for example, be skived PTE (having a thickness of about 1 mil) or teflon coated glass (having a thickness of about 3 mils). The release film 202 may be a separate film, as shown, or alternatively, may be incorporated into the conformable material 204.

Figure 11:
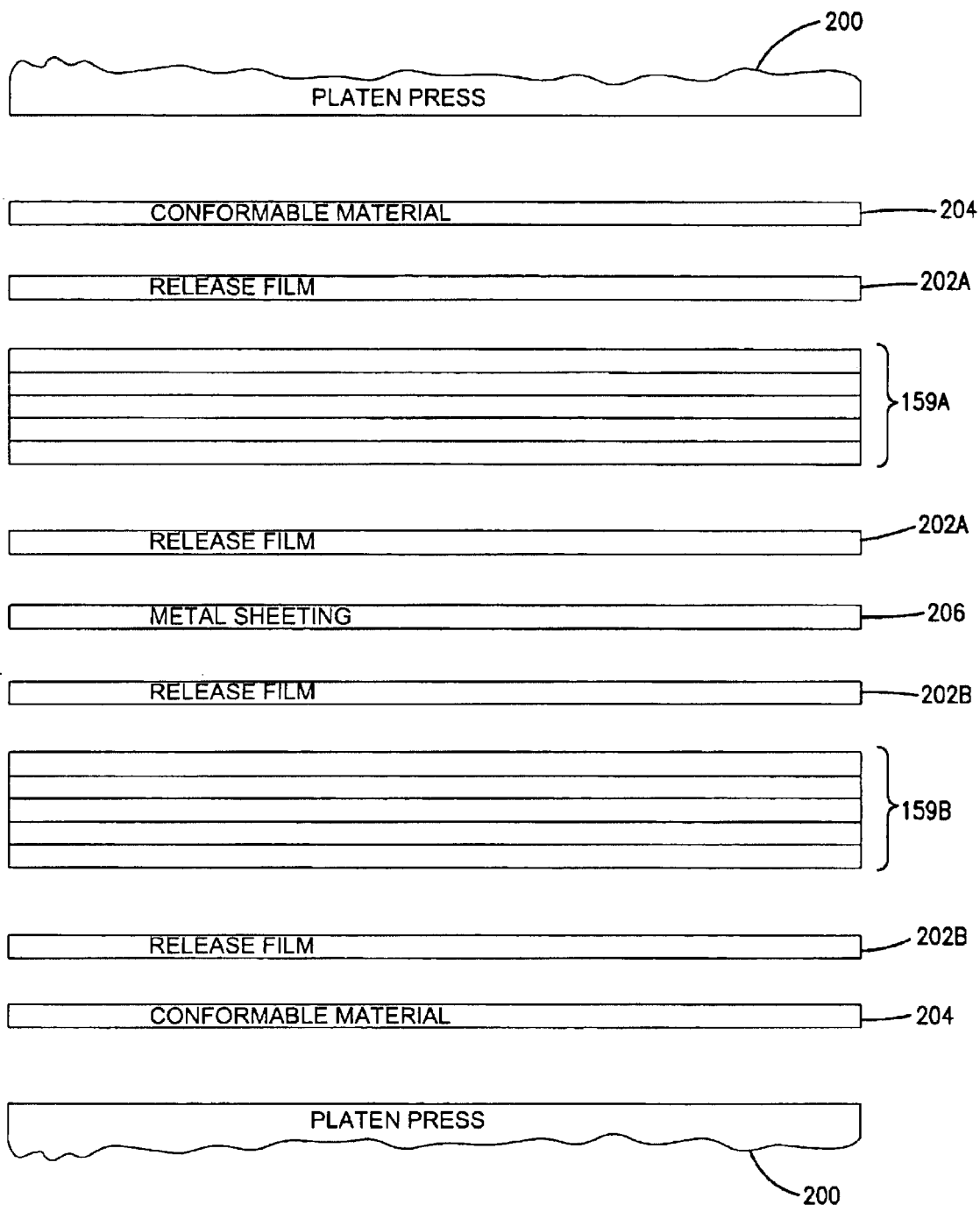
FIG. 11 shows one method for fabricating two lay-up portions simultaneously.

FIG. 11 shows one arrangement that may be used to fabricate two lay-ups 159A, 159B simultaneously. The arrangement and process of fabrication are substantially the same as that described above with respect to FIG. 10, except that there are two lay-ups 159A, 159B, two pairs of release films 202A, 202B, and a metal sheeting 206 interposed between the two lay-ups. The thickness of the metal sheeting 206 is, for example, between about 0.02 and about 0.03 inches.

In some embodiments, more than two lay-ups (e.g., 4–6) are fabricated simultaneously. This can be accomplished by adding additional lay-ups and metal sheeting to the arrangement.

Figure 12:
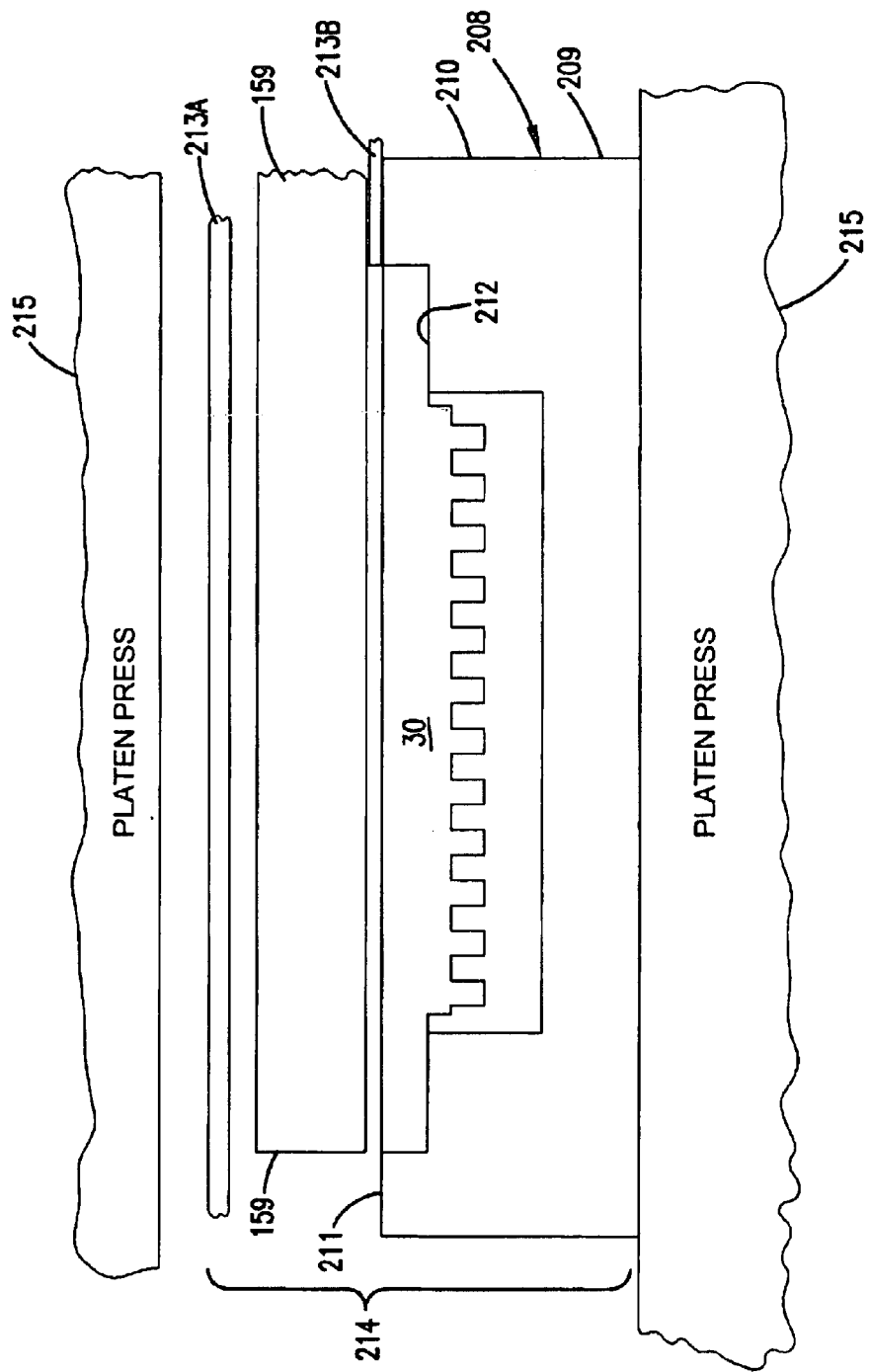
FIG. 12 shows one method for attaching the lay-up portion of FIG. 8 to the heat sink of FIG. 8.

FIG. 12 illustrates one method for attaching the lay-up portion 159 to the heat sink 30. In this method, the heat sink 30 is positioned in a fixture 208. The fixture 208 has a foundation portion 209 and side walls 210. The side walls 210 have a major upper surface 211 and abutments 212. The abutments 212 are recessed from the major upper surface 211 such that upon placing the heat sink 30 in the fixture 208, the major upper surface 211 is flush with the major outer surface of the heat sink 30. The foundation portion 209 is recessed to provide clearance between the fixture 208 and the heat sink 30.

After the heat sink 30 is positioned in the fixture 208, the lay-up 159 is positioned above the heat sink 30. A release film 213A is positioned over the lay-up 159. A release film 213B is positioned between the lay-up 159 and the major upper surface 211 of the fixture 208. The assembly 214 (i.e., fixture 208, heat sink 30, lay-up 159, release film 213) is placed into a platen press 215. The platens 215 are heated to about 300 degrees centigrade (deg C.). The force on the assembly 214 is initially only that of the weight of the platen

215. The initial temperature and force conditions are maintained for a time duration of about 2 to 3 seconds. A force of about 1000 pounds is then applied to the platen 215, which in turn delivers the force to the assembly 214. This force is intended to help drive trapped air out of the assembly 214. This force may be applied for about 15 to 30 seconds.

The force and/or the temperature is then increased to provide conditions (e.g., temperature, pressure, time duration) to re-activate the adhesive layer 158 to a degree sufficient to form a bond between the lay-up 159 and the heat sink 30. For example, in this embodiment, the temperature is maintained at about 300 deg C. and the applied force is increased to greater than or equal to about 4000 pounds. These conditions are maintained for about 30 seconds. The assembly 214 is then removed from the platen press 215. The lay-up/heat sink are then removed from the fixture 208. In some embodiments, the fixture 208 includes an ejection mechanism (not shown) to eject the heat sink 30 from the fixture 208.

In some embodiments, the heat sink 30 undergoes surface preparation prior to attaching the lay-up 159. For example, in some embodiments, a coating is applied to the major outer surface of the heat sink 30 in order to fill any recesses in the surface of the outer major surface, and thereby provide a more uniform surface for bonding to the lay-up 159. The coating may comprise a polyamide material in liquid etch form, although it is not limited to such.

Although FIG. 12 shows only one lay-up 159 and only one heat sink 30, it should be recognized that some embodiments may attach multiple lay-ups to multiple heat sinks simultaneously.

The electrical components are mounted on the laminate after the lay-up 159 has been attached to the heat sink 30. Mounting of the electrical components may be carried out using any suitable process. One suitable process includes: 1) applying a solder paste onto the laminate, 2) appropriately positioning the electrical components onto the solder paste and 3) wave soldering to heat the solder paste and solder the electrical components onto the board. A stencil is sometimes used to help apply the solder paste to the laminate. Another suitable process uses an oven, rather than wave soldering, to heat the solder paste to affix the components to the laminate. Some embodiments employ thermocouples to monitor the temperature of the laminate and/or electrical components during the wave soldering (or oven heating) portion of the process.

Although the first multi-layer laminate 21 of the power supply assembly 20 has a single second portion 26 that is folded to form a single substantially planar surface 142, the present invention is not limited to laminates that have only one folded portion.

Figure 13:
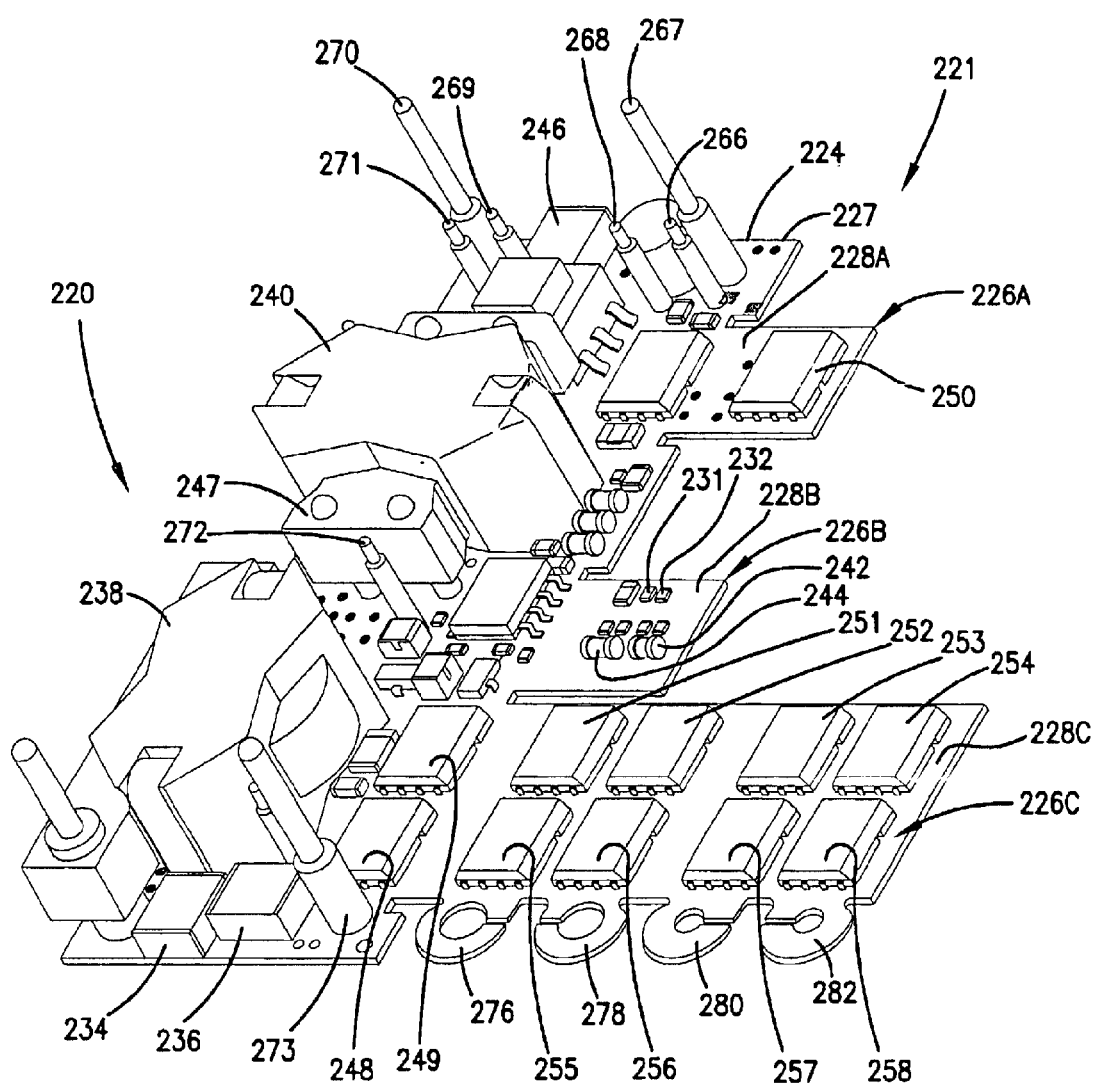
FIG. 13 is a partially assembled, perspective view of a power supply assembly having a multi-layer laminate in accordance with a second embodiment of the present invention.

FIG. 13 is a perspective view of a power supply assembly 220 (shown in a partially assembled state) which employs a multi-layer laminate 221 according to a second embodiment of the present invention. The multi-layer laminate 221 has a first portion 224 and a second portion having three sub-portions 226A, 226B, 226C each of which is separately attached to the first portion 224. The first portion 224 has a first major surface 227. Each of the sub-portions 226A–226C has a first major surface (i.e., 228A–228C, respectively) and as will be further described hereinafter, is to be folded in the course of further assembling the power supply assembly 220.

A plurality of electrical devices are mounted on the multi-layer laminate 221. The electrical devices include various types of devices, for example, resistors 231, 232, capacitors 234, 236, transformers 238, 240, diodes 242, 244, and integrated circuits 246–249 mounted on the major surface 227 of the first portion 224, and integrated circuits 250–258 mounted on the major surfaces 228A-C of the sub-portions 226A–226C, respectively. As in the first embodiment, these devices are shown having a surface mountable form, however, this is not a requirement of the present invention.

Figure 14:
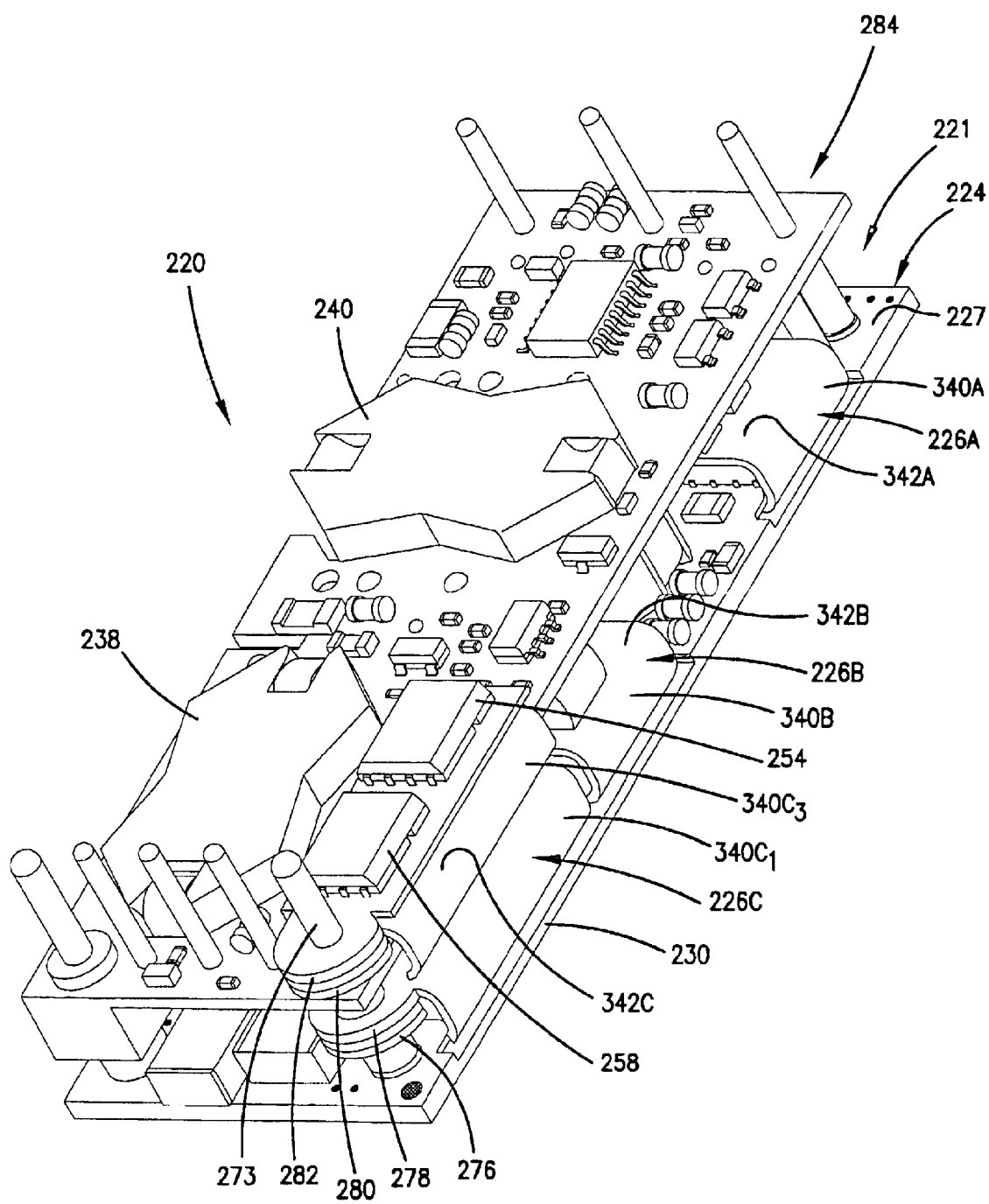
FIG. 14 is a partially-assembled perspective view of the power supply assembly of FIG. 14 illustrating the three sub-portions of the first laminate of FIG. 13 each in a folded state.

A plurality of support members 266–273 extend from the multi-layer laminate 221. These support members 266–273 position and support a second laminate 280 (FIG. 14) at a predetermined distance above the multi-layer laminate 221. The predetermined distance is selected so as to maintain clearance between the second laminate 280 (FIG. 14) and upper surfaces of the tallest devices (not shown) overlayed by the second laminate 222 (FIG. 14). The support members 267, 270 and 273 have pin-shaped ends that serve as input and output terminals for the power supply assembly 220.

The third sub-portion 226C of the multi-layer laminate 221 has hangars 276, 278, 280, 282 that are attachable to the support member 273. As will be further described hereinafter, the support member 273 provides structural support for the third sub-portion 226C when such portion 226C is in a folded state. Each of the hangars 276–282 has a slotted portion 82 to receive the support member 273 and attach the hangar 276–282, respectively, thereto. Unlike the third sub-portion 226C, the first and second sub-portions 226A, 226B do not have any hangars to attach to a support member.

As described above for the first laminate 21, the multi-layer laminate 221 is formed by attaching a printed circuit to a heat sink. The printed circuit of the multi-layer laminate 221 has substantially the same types of layers as the first portion 24 (FIGS. 1, 2) of the multi-layer laminate 21. The heat sink of the multi-layer laminate 221 is substantially similar to the heat sink 30 (FIGS. 1, 2) of the multi-layer laminate 21.

FIG. 14 is a partially-assembled perspective view of the power supply assembly 220 with the three sub-portions 226A–226C each in a folded state. A second laminate 284 is also shown.

The sub-portion 226A of the multi-layer laminate 221 has one fold 340A and a substantially planar portion 342A that overlays a first fractional portion of the first major surface 227 of the first portion 224. Device 250 (FIG. 13), which is mounted on the substantially planar portion 342A, overlays and physically rests on device 246 (FIG. 13), which is mounted on the first fractional portion of the first major surface 227.

Likewise, the sub-portion 226B has one fold 340B and a substantially planar portion 342B that overlays a second fractional portion of the first major surface 227 of the first portion 224. Devices 231, 232, 242, 244 (FIG. 13), which are mounted on the substantially planar portion 342B, overlay and may physically rest on device 247 (FIG. 13) mounted on the second fractional portion of the first major surface 227.

In contrast, the third sub-portion 226C has four folds 340C$_1$–340C$_4$ (see also FIG. 15) and four substantially planar portions 342C$_{1-4}$ (see also FIG. 15), thereby forming a stack that overlays a third fractional portion of the first major surface 227 of the first portion 224. Devices 251, 255 (FIGS. 13, 15) are mounted on the first substantially planar portion 342C$_1$. Devices 252, 256 (FIGS. 13, 15) are mounted on the second substantially planar portion 342C$_2$.

Devices 253, 257 (FIGS. 13, 15) are mounted on the third substantially planar portion 342C$_3$. Devices 254, 258 (FIGS. 13, 15) are mounted on the fourth substantially planar portion 342C$_4$. Devices 251–254 overlay device 249 (FIGS. 13, 15) mounted on the third fractional portion of the first portion 224. Devices 255–258 (FIGS. 13, 15) overlay device 248 also mounted on the third fractional portion (FIGS. 13, 15).

The hangars 276, 278, 280 and 282 are attached to the support member 273, which provides structural support for the third sub-portion 226C in the folded state. In some embodiments, the support member 273 also acts as an additional thermal path to help remove heat from the devices mounted on the sub-portion 226C.

With the three sub-portions 226A–226C folded as such, devices 250, 231, 232, 242, 244, 251–254 and 255–258 (FIG. 13) are "packed" into areas that would otherwise be unused in this embodiment. As a result, less volume may be needed, thereby helping to achieve a desired power density. Moreover, in this embodiment, this is accomplished without the need to add additional connectors, thereby avoiding the added weight, labor and cost, typically associated therewith.

Figure 15:
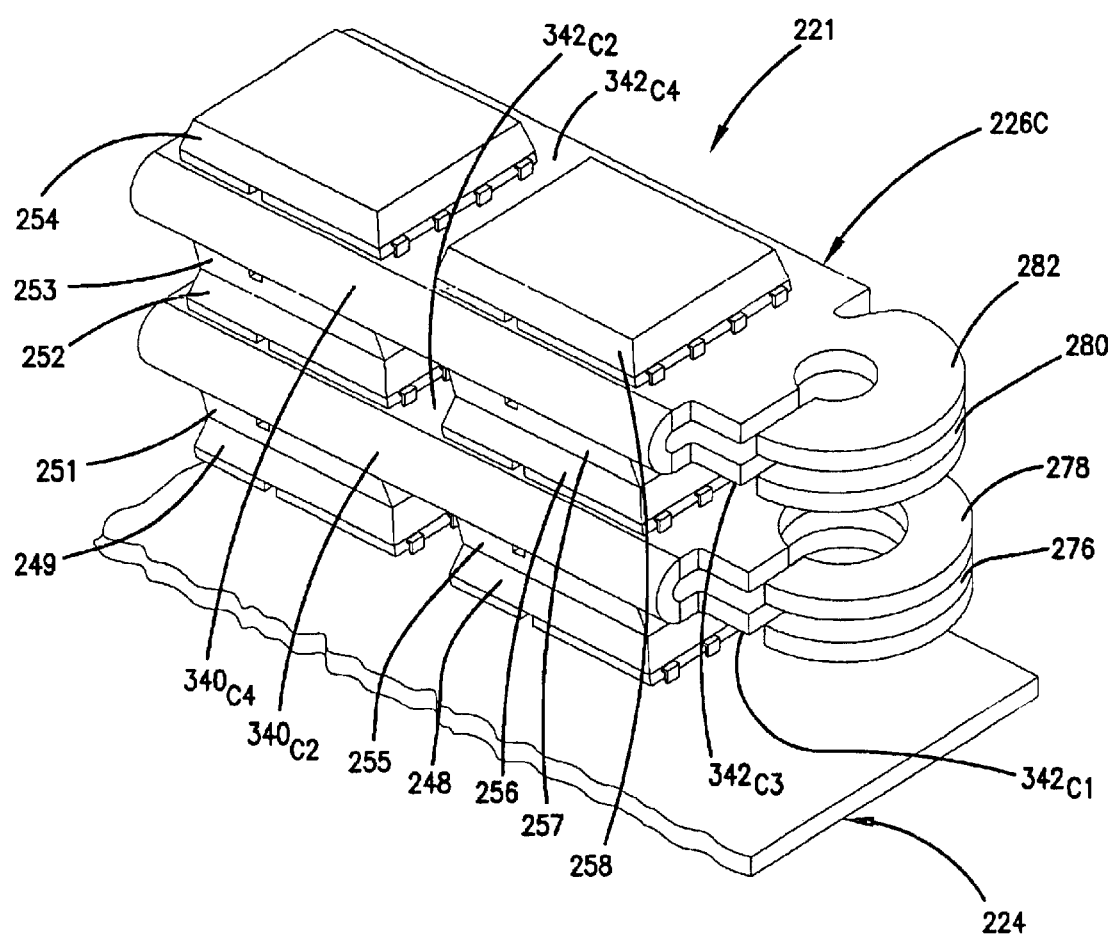
FIG. 15 is a perspective view of a sub-portion of the first laminate of FIGS. 13, 14 in a folded state.

FIG. 15 is a perspective view of a portion of the multi-layer laminate 221 with sub-portions 226C in a folded state.

Figure 16:
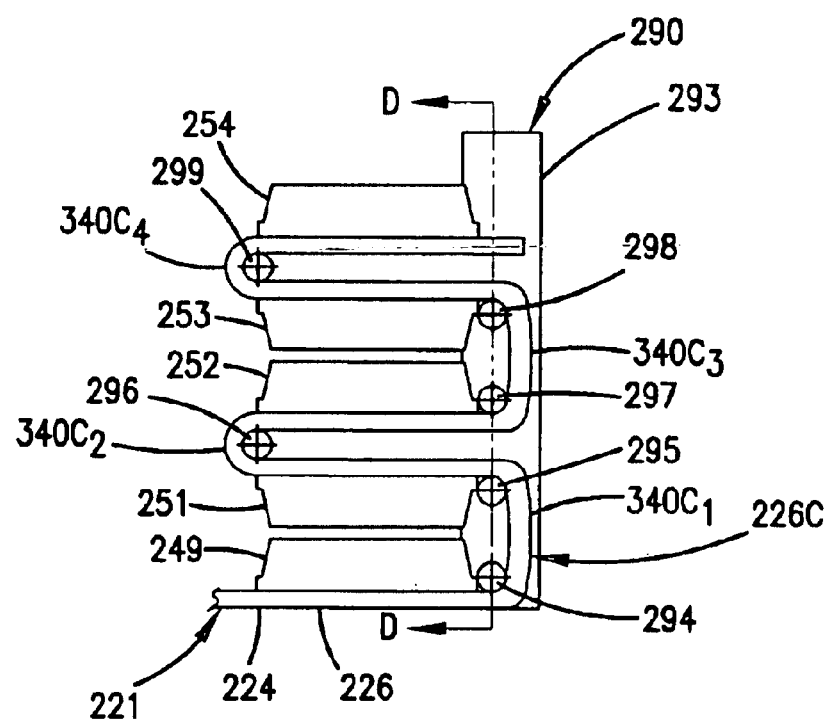
FIG. 16 is a cross-sectional view of a portion of the laminate of FIG. 13, with the second portion in an un-folded state, in combination with a cross sectional view of a fixture that may be employed in folding the second portion.
Figure 17:
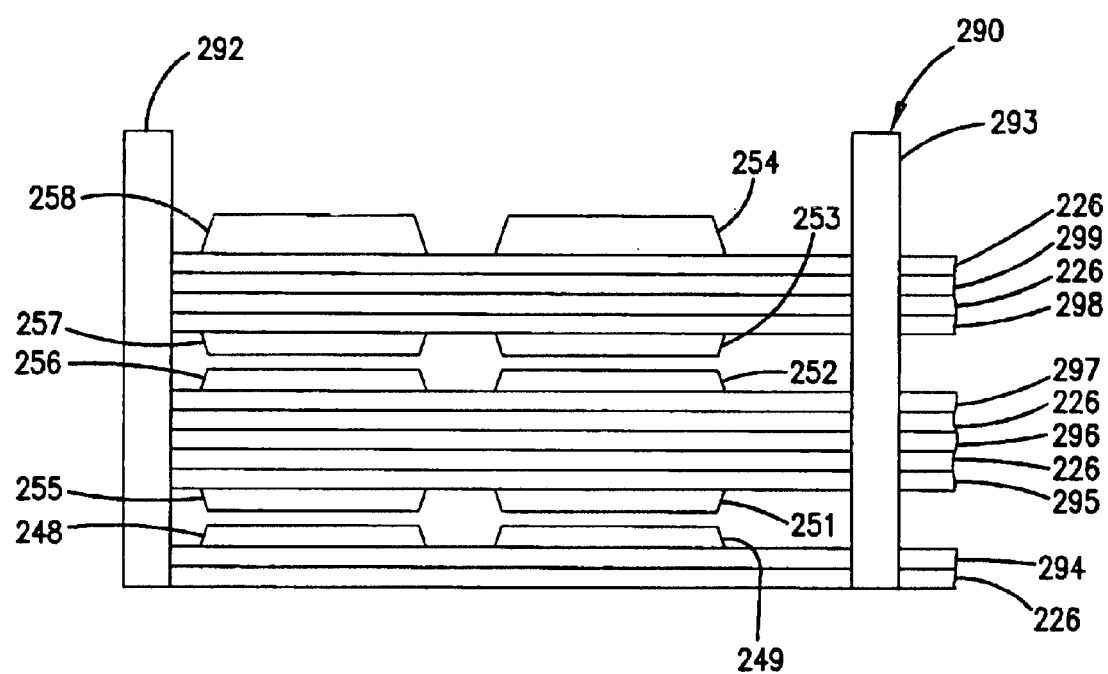
FIG. 17 is a cross-sectional view of a portion of the laminate of FIG. 13, with the second portion in a folded state, in combination with a cross-sectional view of the fixture of FIG. 16.

FIGS. 16–17 are cross-sectional views of a portion of the laminate 221, with the electrical devices mounted thereon, that show one method for forming the folds 340C$_1$–340C$_4$. As with the method shown in FIGS. 4–7, the method of FIGS. 16–17 employs a fixture 290 to assist the folding process. The fixture 290 includes a base (not shown) and supports 292, 293. The fixture 290 further includes guide members 294–299, which are supported by the supports 292, 293 and extend in the direction in which the folds 340 (FIG. 15) are to extend. The guide members 294–299 may be cylindrically shaped, as shown, but are not limited to such.

In some embodiments, a multi-layer laminate further includes one or more heat sinks that attach to one or more of the substantially planar portions.

Figure 18:
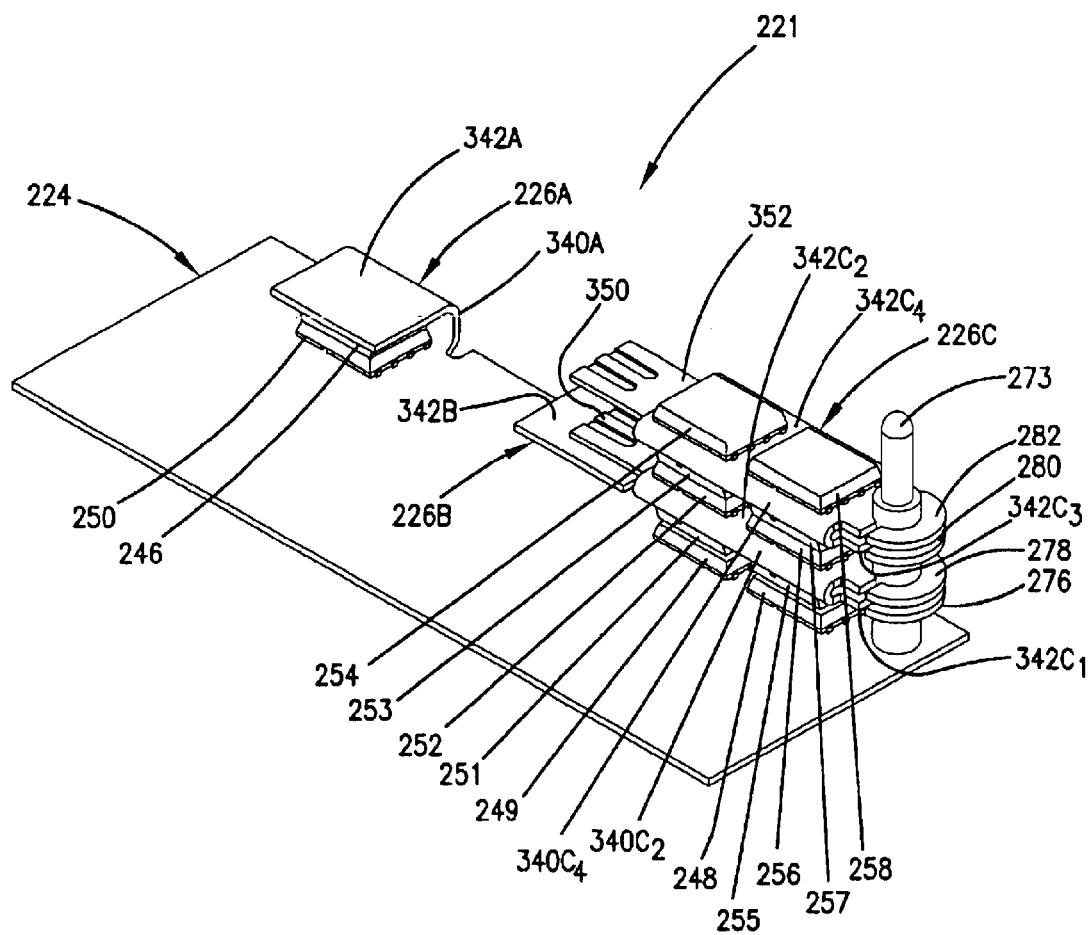
FIG. 18 is a perspective view of a portion of a multi-laminate according to another embodiment of the present invention.
Figure 19:
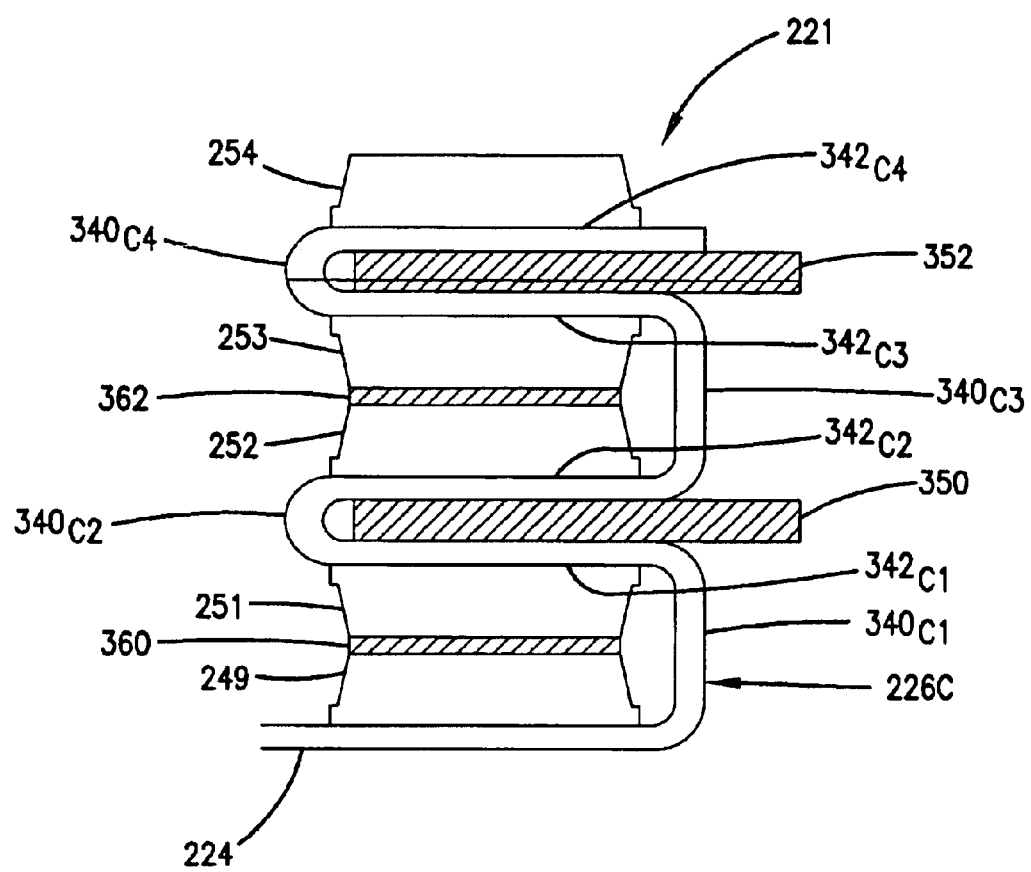
FIG. 19 is a cross sectional view of the multi-layer laminate of FIG. 18.

FIG. 18 is a perspective view of one embodiment of the multi-layer laminate 221 having heat sinks 350, 352 attached to the substantially planar portions of the third sub-portion 226C. FIG. 19 is a cross sectional view of the multi-layer laminate 221 with the heat sinks 340, 342. Referring to FIG. 19, the first heat sink 350 is disposed between and attached to a major outer surface of the first substantially planar portion 342C$_1$ and a major outer surface of the second substantially planar portion 342C$_2$. The second heat sink 352 is disposed between and attached to a major outer surface of the third substantially planar portion 342C$_3$ and a major outer surface of the fourth substantially planar portion 342C$_4$.

The heat sinks 350, 352 help remove heat from the stack. Some other embodiments may attach one or more heat sinks (not shown) to one or more of the other substantially planar portions 342A, 342B. Yet other embodiments may connect the heat sinks to the support member 273 to further improve the thermal path out of the stack. It should be recognized that although each of the heat sinks 350, 352 is shown with three fins, heat sinks are not limited to such, i.e., other types of heat sinks may also be used.

Figure 20:
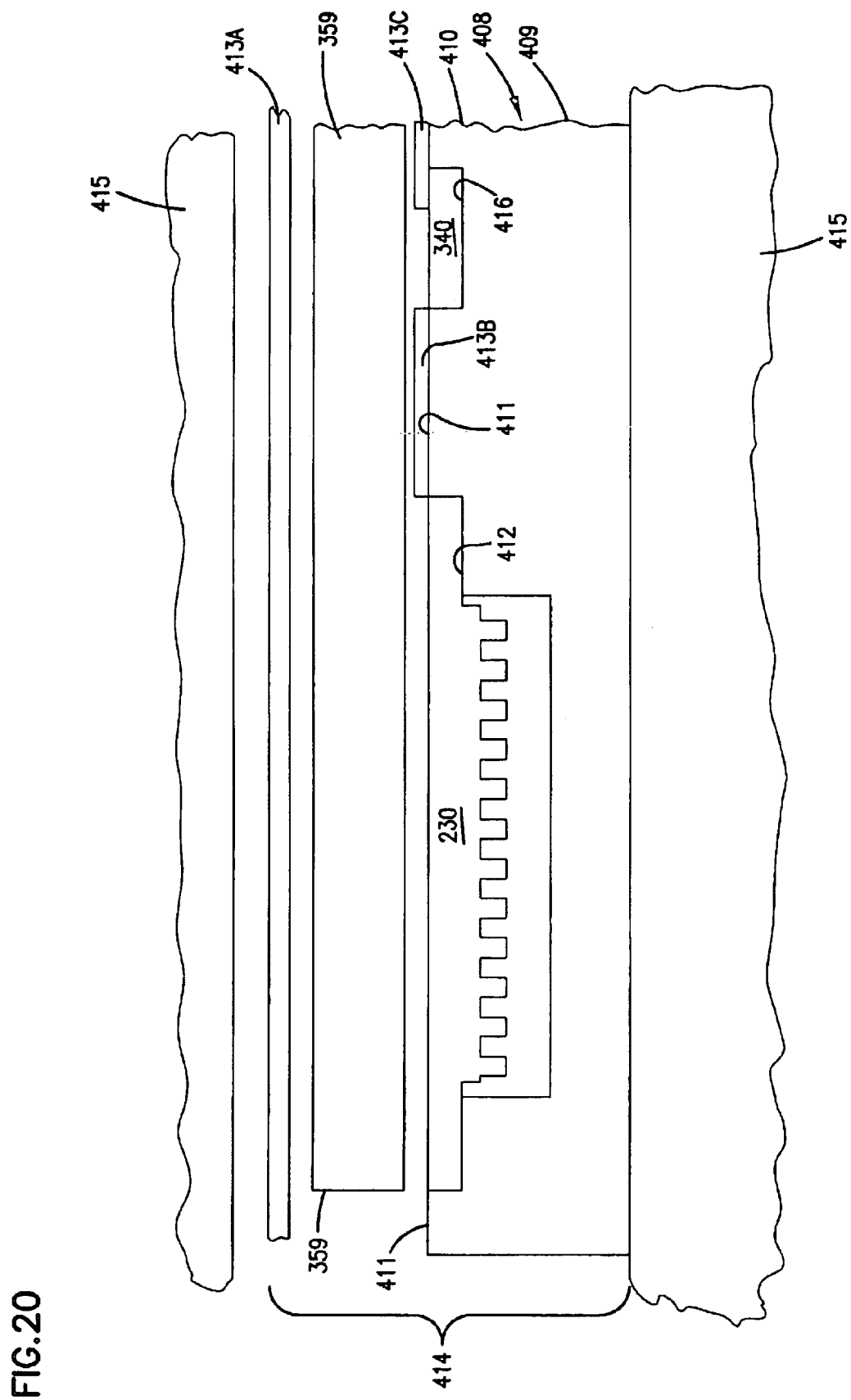
FIG. 20 shows one method for attaching the heat sinks and the lay-up of FIG. 19.

FIG. 20 illustrates one method for attaching the heat sinks 340, 342 at the same time as the heat sink 230 is attached. Hereafter, except where otherwise noted, features identified by reference numerals preceded by a numeral "3" are similar to features identified by reference numerals preceded by a numeral "1". Similarly, features identified by reference numerals preceded by a numeral "4" are similar to features identified by reference numerals preceded by a numeral "2". For example, in this method, the heat sinks 230, 340 and heat sink 342 (FIG. 19) are positioned in a fixture 408. The fixture 408 is similar to the fixture 208 (FIG. 12) except that the fixture 408 includes an abutment 418 that bounds a recess for receiving the heat sink 340. The fixture 408 further includes an abutment (not shown) that bounds a recess for receiving the heat sink 342.

After the heat sinks 230, 340, 342 (FIG. 19) are positioned in the fixture 408, the lay-up 359 and release films 413A–413C are positioned. The assembly 414 (i.e., fixture 408, heat sinks 230, 340, 342 (FIG. 19) lay-up 359, release film 413A–413C) is placed into a platen press 415. The platens 415 are heated and force is applied to attach the heat sinks to the lay-up.

Referring again to FIG. 20, an adhesive layer 360 may be employed to bond the electrical device 249 to the electrical device 251. Likewise, an adhesive layer 362 may be employed to bond the electrical device 252 to the electrical device 253. In some embodiments, the adhesive layers 360, 362 comprise a thermally conductive material.

Although FIGS. 13–19 shows the electrical devices 251–258 being mounted on the same side of the third sub-portion 226C, and further shows two of the folds (e.g., 340C$_1$, 340C$_3$) having a larger radius than the other two folds (e.g., 340C$_2$, 340C$_4$), it should be understood that the present invention is not limited to such.

Figure 21:
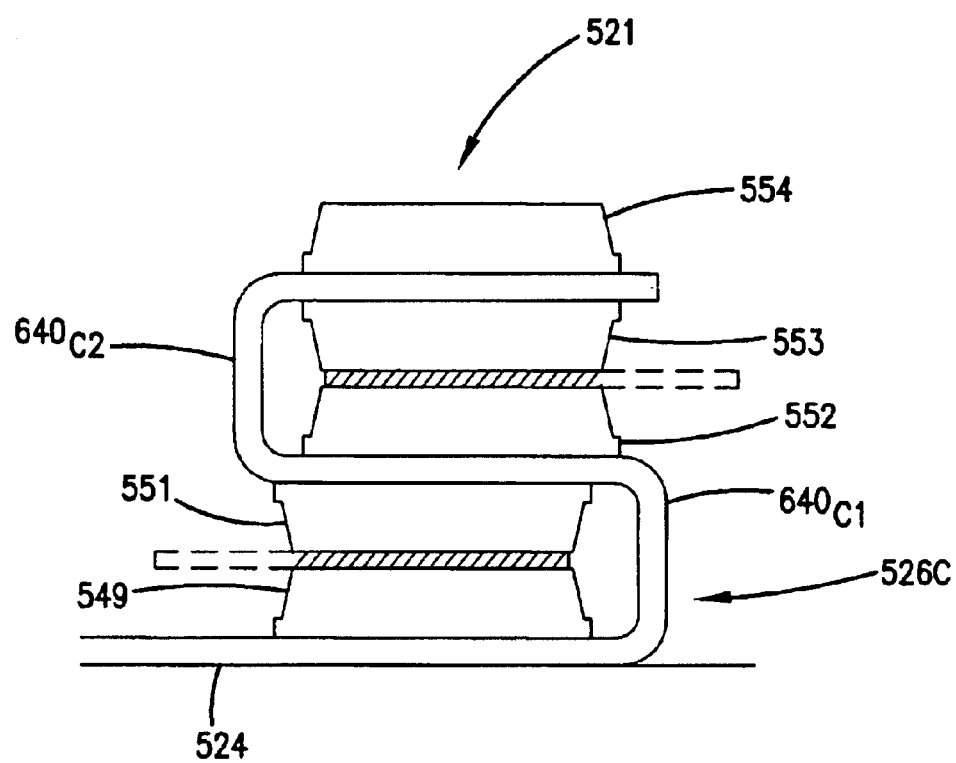
FIG. 21 is a cross sectional view of a multi-layer laminate according to another embodiment of the present invention.

FIG. 21 is a cross sectional view of a multi-layer laminate 521 according to another embodiment of the present invention. Except where otherwise noted, features identified by reference numerals preceded by a numeral "5" are similar to features identified by reference numerals preceded by a numeral "2". Similarly, features identified by reference numerals preceded by a numeral "6" are similar to features identified by reference numerals preceded by a numeral "3". For example, the multi-layer laminate 521 has first and second portions 524, 526. The first and second portions 524, 526 are similar to the first and second portions 224, 226 of the multi-layer laminate 221 of FIGS. 13–15 and 16–19 with two exceptions. First, the second portion 526 of the multi-layer laminate 521 has electrical devices mounted on both of its major outer surfaces (electrical devices 551, 554, 555, 558 are mounted on one major outer surface of the second portion 526, electrical devices 552–553, 556–557 are mounted on a second major outer surface of the second portion 526). Second, the second portion 526 of the multi-layer laminate 521 has two folds 640C$_1$–640C$_2$, instead of four 340C$_1$–340C$_4$. In this embodiment, unlike the embodiments of FIGS. 13–19, each of the folds 640C$_1$–640C$_2$ have approximately the same radius as one another.

Although embodiments shown above each have two multi-layer laminates stacked on one another, the present invention is not limited to such. For example, some embodiments may employ only one laminate. Some other embodiments may employ more than two laminates.

Furthermore, although the embodiments of the laminates shown above each include two electrically conductive layers that form a printed circuit to electrically connect to the electrical devices to be mounted on the laminates, the present invention is not limited to such. For example, in some embodiments, a printed circuit with only one electrically conductive layer may be needed. In some other embodiments, the printed circuit may require more than two electrically conductive layers.

Moreover, it should also be recognized that there are many types of electrical devices. For example, some types of electrical devices are referred to as discrete devices. Exemplary types of electrical devices include discrete devices, integrated circuit devices, and hybrid devices. Exemplary discrete devices include discrete resistors, capacitors, inductors as well as discrete semiconductor devices (e.g., diodes, transistors). Integrated circuits are commonly formed from semiconductors. Although some embodiments of the present invention may provide characteristics that are particularly advantageous for "high power" systems or applications, for example, as found in some power supply systems or applications, the present invention is not limited to any particular type or types of electrical devices or any particular application or applications.

Electrical devices can be packaged in many different ways. The present invention is not limited to any particular type of package. Thus, for example, although the first laminate 21 is shown adapted to receive surface-mount type electrical devices (e.g., 102, 104) with "gull-wing" type leads (e.g., 114, 116), the present invention is not limited to such. For example, other embodiments may be adapted to receive other types of devices, including but not limited to, for example, other types of surface-mount devices with other types of terminals (e.g., pin grid arrays and/or ball arrays) and non surface-mount devices (e.g., dual-in-line packages) or combinations thereof. Consequently, although the terminals 118, 120 are shown as being in the form of pads, other embodiments may employ other types of structures for electrically connecting to the electrical devices, for example, but not limited to plated holes.

As stated above, the first portion of the first laminate may be attached to a chassis or other structure (not shown). Thus, in some embodiments, the first portion further includes slots (not shown) for bolts (not shown) that attach the first laminate to the chassis or other structure. Some other embodiments may employ some other type of fastener or fastening arrangement (e.g., clamp(s)) to attach the first laminate to the chassis or other structure. Yet other embodiments may employ adhesive(s). Still further embodiments may employ combinations of two or more of these structures.

In some other embodiments, the first portion may not attach to a housing or other structure.

As stated above, the heat sink is not required to be metal. For example, some embodiments may employ a heat sink that is a ceramic material and/or a ferromagnetic rather than metal. In some other embodiments, the heat sink may comprise a combination of ceramic, ferromagnetic and metal materials.

As used herein, and except where otherwise stated, the phrase "substantially rigid" implies at least substantially rigid, so as not to preclude rigid.

In addition, although the heat sink shown in FIGS. 2 and 8 has one major outer surface that is substantially planar and one major outer surface having fins extending therefrom, the present invention is not limited to such. For example, in some embodiments, both of the major outer surfaces of the heat sink may be substantially planar. In some other embodiments, the heat sink does not have a major outer surface that is substantially planar, but rather has one or more major outer surfaces that are curved, spherical, piecewise-planar, irregular and/or combinations thereof. In some embodiments, the heat sink has only one major outer surface, for example where the heat sink is spherical. A heat sink may be fabricated in one piece, or alternatively, fabricated in separate pieces and then joined together.

Although the method disclosed above for forming the lay-up employs a platen press and the platens have heating elements, the present invention is not limited to methods that employ a platen press and/or platens with heating elements.

Note that, except where otherwise stated, the phrase a "printed circuit" is open ended, meaning that it includes, but is not limited to, at least one electrically conductive layer that provides at least a portion of a printed circuit. For example, a printed circuit may include layers other than electrically conductive layers.

As used herein, the phrase "fractional portion" means less than the entirety, for example, but not limited to, ¾, ½ or ¼. Thus, in some embodiments, the substantially planar portion of the second portion overlays ¾ of the major outer surface of the first portion. In some other embodiments, the substantially planar portion may overlay only ½ or ¼ of the major outer surface of the first portion. Generally speaking, increasing the fractional portion to be overlayed increases the potential packing of the electrical components.

As used herein, the term "layer" implies a position in the cross section (profile) of the laminate. However, a layer may be continuous or discontinuous. For example, a conductive layer may be an etched printed circuit layer. Moreover, a layer may or may not be planar or even substantially planar. For example, a conformal layer on a non-planar surface will be non-planar.

As used herein, the term "metal", if used as an adjective to describe a structure, means that the majority of a structure is composed of one or more metals. However, the composition of a "metal" structure may be homogeneous (uniform throughout) or non-homogeneous (non-uniform throughout).

As used herein, except where otherwise stated, the phrase "bond" implies relatively firm adhesion, which at least after some elapsed time and/or cooling, is sufficient for the intended use of the laminate. However, the phrase "tack bond" implies relatively weak adhesion that is insufficient for the intended use of the laminate.

Note that, except where otherwise stated, phrases such as, for example, "connected to" mean "connected directly to" or "connected indirectly to".

Also note that, except where otherwise stated, terms such as, for example, "comprises", "has", "includes", and all forms thereof, are considered open-ended, so as not to preclude additional elements and/or features.

While there have been shown and described various embodiments, it will be understood by those skilled in the art that the present invention is not limited to such embodiments, which have been presented by way of example only, and that various changes and modifications may be made without departing from the spirit and scope of the invention. Accordingly, the invention is limited only by the appended claims and equivalents thereto.

What is claimed is:

1. A circuit comprising:

a multi-layer laminate having a first portion and a second portion, the first portion having a first major surface and an electrically conductive layer, the first major surface being adapted to receive one or more electrical devices to be mounted thereon, the electrically conductive layer having one or more conductive traces to be electrically connected to one or more of the electrical devices to be mounted on the first portion, the second portion being attached to the first portion and folded so as to form at least one substantially planar portion that overlays a fractional portion of the first major surface of the first portion and on which one or more electrical devices may be mounted, the at least one substantially planar portion having an electrically conductive layer having one or more conductive traces to be electrically connected to one or more of the electrical devices to be mounted on the at least one substantially planar portion of the second portion;

at least one electrical device mounted on the first portion; and at least one electrical device mounted on the at least one substantially planar portion of the second portion.

2. The circuit of claim 1 wherein the second portion is formed integrally with a marginal portion of the first portion and extends outwardly therefrom.

3. The circuit of claim 1 wherein the first portion further includes a heat sink bonded to a second major surface of the first portion.

4. The circuit of claim 3 wherein the heat sink is substantially rigid.

5. The circuit of claim 1 wherein the second portion is substantially flexible.

6. The circuit of claim 1 wherein the fractional portion of the first major surface of the first portion is substantially planar and at least one of the at least one planar portions is disposed substantially parallel to said fractional portion.

7. The circuit of claim 1 wherein the first portion and the second portion are integrally formed of a multi-layer flexible laminate.

8. The circuit of claim 1 wherein the fractional portion is less than three quarters of the first major surface of the first portion.

9. The circuit of claim 1 wherein the fractional portion is less than one half of the first major surface of the first portion.

10. The circuit of claim 1 wherein the fractional portion is less than one quarter of the first major surface of the first portion.

11. The circuit of claim 1 further comprising a support member that extends from the first portion and supports at least one of the at least one substantially planar portions of the second portion.

12. The circuit of claim 11 further comprising an input signal and an output signal, and wherein the support member is electrically connected to at least one of the input signal and the output signal.

13. The circuit of claim 1 further comprising a heat sink attached to at least one of the at least one substantially planar portions of the second portion.

14. The circuit of claim 11 further comprising a heat sink attached to at least one of the at least one substantially planar portions and in electrical communication with the support member.

15. The circuit of claim 14 wherein the heat sink is electrically connected to the support member.

16. The circuit of claim 1 wherein the at least one substantially planar portion comprises a plurality of substantially planar portions that overlay one another and a fractional portion of the first major surface of the first portion.

17. The circuit of claim 1 wherein the second portion comprises a plurality of sub-portions each of which is attached to the first portion and is folded so as to provide at least one substantially planar surface that overlays an associated fractional portion of the first major surface of the first portion and on which one or more electrical devices may be mounted.

18. The circuit of claim 1 wherein the first major surface of the first portion faces in a direction toward the at least one substantially planar portion.

19. The circuit of claim 1 wherein at least one of the at least one electrical device mounted on the first portion extends to a first height above the first portion, and at least one of the at least one substantially planar portion of the second portion is at a second height above the first portion, the second height being less than the first height.

20. The circuit of claim 1 wherein one or more tallest ones of the at least one electrical device mounted on the first portion extends to a first height above the first portion, and one or more tallest ones of the at least one electrical device mounted on at least one of the at least one substantially planar portion extends to a second height above the first portion, the second height being less than the first height.

21. The circuit of claim 1 wherein one or more tallest ones of the at least one electrical device mounted on the first portion extends to a first height above the first portion, and one or more tallest ones of the at least one electrical device mounted on at least one of the at least one substantially planar portion extends to a second height above the first portion, the second height being approximately equal to the first height.

22. The circuit of claim 1 wherein the at least one electrical device mounted on the first portion occupy a first volume, and the at least one electrical device mounted on the at least one substantially planar portion are positioned within second volume that is bounded in part by the first volume and overlays a fractional portion of the first major surface of the first portion.

23. A circuit comprising:

a multi-layer laminate having a first portion having a first major surface and an electrically conductive layer, the first major surface being adapted to receive one or more electrical devices to be mounted thereon, the electrically conductive layer having one or more conductive traces to be electrically connected to one or more of the electrical devices to be mounted on the first portion, the second portion being attached to the first portion and folded so as to form at least one substantially planar portion that overlays a fractional portion of the first major surface of the first portion and on which one or more electrical devices may be mounted, the at least one substantially planar portion having an electrically conductive layer having one or more conductive traces to be electrically connected to one or more of the electrical devices to be mounted on the at least one substantially planar portion of the second portion;

means for providing at least one substantially planar portion that overlays a fractional portion of the first major surface of the first portion and on which one or more electrical devices may be mounted and electrically connected to, said means being attached to the first portion and folded; and at least one electrical device mounted on the first portion; and at least one electrical device mounted on the at least one substantially planar portion of the second portion.

24. A method comprising:

providing a multi-layer laminate having a substantially rigid portion and a substantially flexible portion, the substantially rigid portion having a first major surface and an electrically conductive layer, the first major surface being adapted to receive one or more electrical devices to be mounted on the substantially rigid portion, the electrically conductive layer having one or more conductive traces to be electrically connected to one or more of the electrical devices to be mounted on the substantially rigid portion, the substantially flexible portion being attached to the substantially rigid portion; and folding the substantially flexible portion so as to form at least one substantially planar portion that overlays a fractional portion of the first major surface of the substantially rigid portion and on which one or more electrical devices may be mounted, the substantially planar portion having an electrically conductive layer having one or more conductive traces to be electrically connected to one or more of the electrical devices to be mounted on the substantially planar portion.

25. A power supply comprising the circuit of claim 1.

26. A power supply comprising the circuit of claim 23.

27. A power supply comprising an circuit fabricated according to the method of claim 24.

28. A circuit comprising:
   a multi-layer laminate including (i) a base portion having a first major surface and an electrically conductive layer, the first major surface being adapted to receive one or more electrical devices to be mounted on the base portion, the electrically conductive layer including one or more traces to be electrically connected to one or more electrical devices to be mounted on the base portion, and (ii) at least one second portion extending from a marginal portion of the base portion and defining a folded portion overlying a fractional portion of the first major surface of the base portion, the folded portion including an electrically conductive layer having one or more conductive traces to be electrically connected to one or more electrical devices to be mounted thereon; and
   at least one electrical device mounted on the folded portion and electrically connected to the conductive layer of the folded portion.

29. The circuit of claim 28 wherein the folded portion is formed integral with the base portion.

30. The circuit of claim 28 further comprising at least one heat sink mounted to the folded portion on an opposite side thereof relative to the at least one electrical device and coupled in thermal communication thereto for transferring heat away from the electrical device.

31. The circuit of claim 28 further comprising a support member extending outwardly from the base and fixedly secured to the folded portion for supporting the folded portion over the base portion.

32. The circuit of claim 31 wherein the support member electrically connects the folded portion to the base portion.

33. The circuit of claim 31 further comprising a heat sink underlying the base portion, and wherein the support member is connected in thermal communication between the folded portion, base portion and the heat sink for transferring heat from at least one of the folded portion and base portion into the heat sink.

34. The circuit of claim 28 wherein the multi-layer laminate further comprises a heat sink underlying the base portion and wherein the base portion further comprises:
   a first electrically isolating layer having a first major surface and a second major surface;
   a first adhesive layer disposed between the first major surface of the electrically isolating layer and the first electrically conductive layer of the base; and
   a second adhesive layer disposed between the heat sink and the second major surface of the first electrically isolating layer.

35. The circuit of claim 30 wherein the second portion further comprises:
   a first electrically isolating layer having a first major surface and a second major surface;
   a first adhesive layer disposed between the first major surface of the electrically isolating layer and the first electrically conductive layer of the second portion; and
   a second adhesive layer disposed between the at least one heat sink and the second major surface of the first electrically isolating layer.

36. The circuit of claim 31 wherein the second portion comprises at least two folded portions defining fold lines therebetween, the at least one electrical device mounted on the folded portion including electrical devices mounted to the at least two folded portions between the fold lines.

37. The circuit of claim 28 wherein the folded portion comprises a hangar that receives a support member to thereby attach the folded portion to the support member.

38. The circuit of claim 36 wherein the at least two folded portions each comprises a hangar that receives the support member to thereby attach the folded portion to the support member.

39. The circuit of claim 28 wherein the first major surface of the first portion faces in a direction toward the folded portion.

40. A circuit comprising:
   a multi-layer laminate including (i) a base portion having a first major surface and an electrically conductive layer, the first major surface being adapted to receive one or more electrical devices to be mounted on the base portion, the electrically conductive layer including one or more traces to be electrically connected to one or more electrical devices to be mounted on the base portion, (ii) first means extending from a marginal portion of the base portion for overlying a fractional portion of the first major surface of the base portion and mounting at least one electrical device thereto, and (iii) second means for electrically connecting the at least one electrical device mounted on the first means to the base portion.

41. The circuit of claim 40 wherein the first means is defined by a folded portion of the multi-layer laminate extending from a marginal portion of the base portion and overlying a fractional portion of the first major surface of the base portion.

42. The circuit of claim 40 wherein the second means is defined by an electrically conductive layer of the first means having one or more conductive traces to be electrically connected to one or more electrical devices to be mounted thereon.

43. A power supply comprising the circuit of claim 28.

44. A power supply comprising the circuit of claim 40.

45. An assembly comprising:
   a multi-layer laminate having a first portion and a second portion, the first portion having a first major surface and an electrically conductive layer, the first major surface being adapted to receive one or more electrical devices to be mounted thereon, the electrically conductive layer having one or more conductive traces to be electrically connected to one or more of the electrical devices to be mounted on the first portion, the second portion being attached to the first portion and being adapted to receive one or more electrical devices mounted thereon;
   at least one electrical device mounted on the first portion and occupying a first volume; and
   at least one electrical device mounted on the second portion;
   wherein the second portion includes means for (i) electrically connecting to the at least one electrical device mounted on the second portion, (ii) electrically connecting at least one of the at least one electrical device mounted on the second portion to at least one of the at least one electrical device mounted on the first portion, and (iii) positioning the at least one electrical device mounted on the second portion within a second volume that is bounded in part by the first volume and overlays a fractional portion of the first major surface of the first portion.

* * * * *

UNITED STATES PATENT AND TRADEMARK OFFICE
CERTIFICATE OF CORRECTION

PATENT NO. : 6,831,835 B2
DATED : December 14, 2004
INVENTOR(S) : Louis Soto

It is certified that error appears in the above-identified patent and that said Letters Patent is hereby corrected as shown below:

<u>Title page,</u>
Item [56], References Cited, U.S. PATENT DOCUMENTS, reference "29,274", "date of 7/1860 and inventor Helton" should read -- date of 2/1915 and inventor Ewart --

<u>Column 1,</u>
Line 25, "circuits boards" should read -- circuit boards --

<u>Column 4,</u>
Line 23, "support members 66-74" should read -- support members 66 and 68-71 --
Line 35, "support members 66-68 and 71-74" should read -- support members 66 and 68-71 --

<u>Column 6,</u>
Line 9, "so as keep" should read -- so as to keep --
Lines 34 and 40, "156 may, comprise" should read -- 156 may comprise --

<u>Column 7,</u>
Line 23, "166, 168" should read -- 156, 158 --

<u>Column 11,</u>
Line 25, "sub-portions 226C" should read -- sub-portion 226C --

Signed and Sealed this

Seventeenth Day of May, 2005

JON W. DUDAS
*Director of the United States Patent and Trademark Office*